US011887677B2

(12) United States Patent
Masuduzzaman et al.

(10) Patent No.: US 11,887,677 B2
(45) Date of Patent: Jan. 30, 2024

(54) QUICK PASS WRITE PROGRAMMING TECHNIQUES IN A MEMORY DEVICE

(71) Applicant: SanDisk Technologies LLC, Addison, TX (US)

(72) Inventors: Muhammad Masuduzzaman, Chandler, AZ (US); Deepanshu Dutta, Fremont, CA (US); Gerrit Jan Hemink, San Ramon, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 128 days.

(21) Appl. No.: 17/701,365

(22) Filed: Mar. 22, 2022

(65) Prior Publication Data
US 2023/0307072 A1  Sep. 28, 2023

(51) Int. Cl.
G11C 16/34  (2006.01)
G11C 16/04  (2006.01)
G11C 16/10  (2006.01)
H10B 41/27  (2023.01)
H10B 43/27  (2023.01)

(52) U.S. Cl.
CPC ...... *G11C 16/3459* (2013.01); *G11C 16/0483* (2013.01); *G11C 16/10* (2013.01); *H10B 41/27* (2023.02); *H10B 43/27* (2023.02)

(58) Field of Classification Search
CPC . G11C 16/3459; G11C 16/0483; G11C 16/10; H10B 41/27; H10B 43/27
USPC .................................................. 365/185.22
See application file for complete search history.

(56) References Cited

U.S. PATENT DOCUMENTS

| 7,447,081 | B2 | 11/2008 | Chan |
| 7,508,721 | B2 | 3/2009 | Li et al. |
| 8,223,556 | B2 | 7/2012 | Dutta et al. |
| 8,559,226 | B2 | 10/2013 | Abe et al. |
| 8,873,298 | B2 | 10/2014 | Shiino et al. |
| 9,548,130 | B2 | 1/2017 | Dutta et al. |
| 9,570,179 | B2 | 2/2017 | Tseng et al. |
| 9,672,926 | B2 | 6/2017 | Shiino et al. |
| 10,121,522 | B1 | 11/2018 | Tseng et al. |
| 10,157,681 | B2 * | 12/2018 | Mokhlesi ........... G11C 16/3459 |
| 10,249,377 | B2 | 4/2019 | Kasai et al. |
| 2013/0163342 | A1 * | 6/2013 | Dutta .................. G11C 11/5628 365/185.21 |
| 2021/0295927 | A1 * | 9/2021 | Park ...................... G11C 16/08 |

(Continued)

*Primary Examiner* — Fernando Hidalgo
(74) *Attorney, Agent, or Firm* — DICKINSON WRIGHT PLLC

(57) ABSTRACT

The memory device includes a controller that is configured to program the memory cells of a selected word line in a plurality of program-verify iterations. During a verify portion at least one of the program-verify iterations, the controller determines a threshold voltage of at least one memory cell relative to a first verify low voltage VL1, a second verify low voltage VL2, and a verify high voltage VH associated with a data state being programmed. The controller also maintains a count of program-verify iterations since the at least one memory cell passed a verify high voltage of a previously programmed data state or discharges a sense node through a channel including the at least one memory cell and compares a discharge time to predetermined sense times associated with the first and second verify low voltages and with the verify high voltage.

20 Claims, 26 Drawing Sheets

(56) References Cited

U.S. PATENT DOCUMENTS

2022/0392531 A1\* 12/2022 Sakurai .................. G11C 16/26
2023/0050399 A1\* 2/2023 Jeong ..................... G11C 16/30

\* cited by examiner

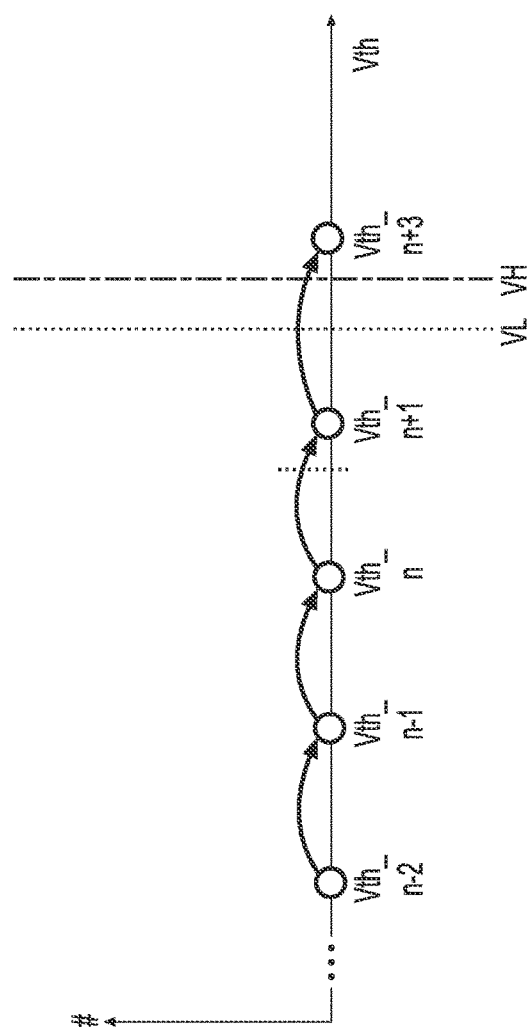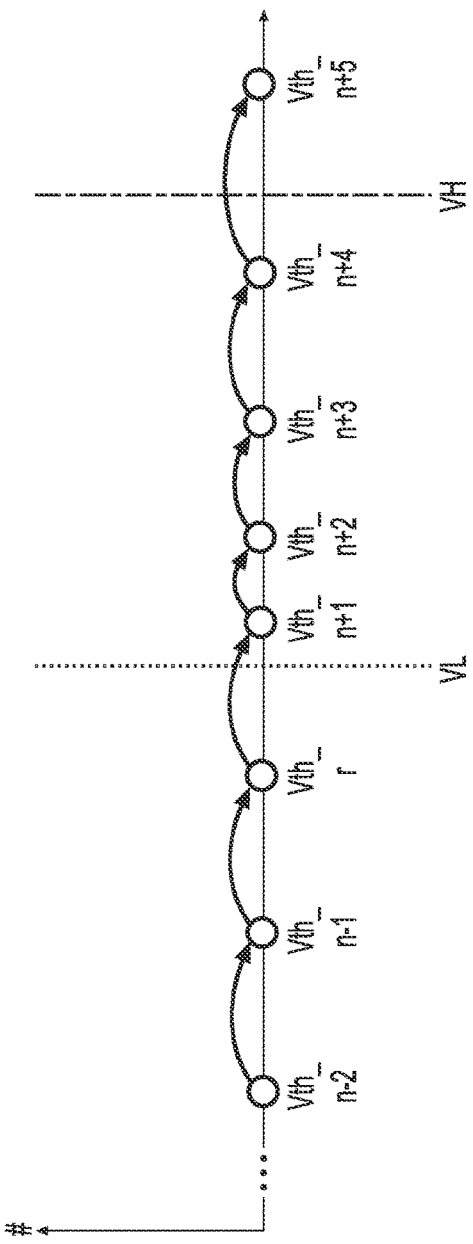

QUICK PASS WRITE PROGRAMMING TECHNIQUES IN A MEMORY DEVICE

BACKGROUND

1. Field

The present technology relates to the operation of memory devices and, more particularly, to more efficient verify techniques to determine if memory cells are in quick pass write (QPW) windows.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

Many memory devices include a plurality of memory cells that are arranged in an array, which includes a plurality of word lines. The memory cells of a selected word line are programmed to respective data states by applying a series of programming pulses to a control gate of the selected word line in a plurality of program-verify iterations to thereby trap electrons in charge-trapping materials of the memory cells. In some programming techniques, known as quick pass write (QPW), programming of a memory cell is slowed as the memory cell approaches the threshold voltage of the data state the memory cell is being programmed to by applying biasing voltages to the memory cells during the applications of the programming pulses.

SUMMARY

One aspect of the present disclosure is related to a method of programming a memory device. The method includes the step of preparing a memory device that includes an array of memory cells arranged in a plurality of word lines. The method proceeds with the step of programming the memory cells of a selected word line of the plurality of word lines in a plurality of program-verify iterations. During a verify portion of at least one program-verify iteration of the plurality of program-verify iterations, the method continues with the step of determining a threshold voltage of at least one memory cell of the selected word line relative to a first verify low voltage VL1, a second verify low voltage VL2, and a verify high voltage VH associated with a data state being programmed. The step of determining the threshold voltage of the at least one memory cell includes maintaining a count of program-verify iterations since the at least one memory cell passed a verify high voltage of a previously programmed data state or includes discharging a sense node through a channel including the at least one memory cell and comparing a discharge time to predetermined sense times associated with the first and second verify low voltages and with the verify high voltage.

According to another aspect of the present disclosure, the method further includes the step of applying a programming pulse to a control gate of the selected word line and applying a first quick pass write (QPW) voltage to at least one bit line coupled with the at least one memory cell in response to a determination in a previous program-verify iteration that the at least one memory cell has a threshold voltage between the first and second verify low voltages VL1, VL2 and applying a second QPW voltage to the at least one bit line coupled with the at least one memory cell in response to a determination in a previous program-verify iteration that the at least one memory cell has a threshold voltage between the second verify low voltage VL2 and the verify high voltage VH and wherein the second QPW voltage is greater than the first QPW voltage.

According to yet another aspect of the present disclosure, no biasing voltage is applied to the at least one bit line coupled with the at least one memory cell in response to a determination in a previous program-verify iteration that the at least one memory cell has a threshold voltage that is less than the first verify low voltage VL1.

According to still another aspect of the present disclosure, the step of determining the threshold voltage of the at least one memory cell includes determining that the threshold voltage of the at least one memory cell includes determining that the threshold voltage of the at least one memory cell is between the first verify low voltage VL1 and the second verify low voltage VL2 in response to the count of program-verify iterations since the at least one memory cell passed verify high of the previous data state being above a predetermined threshold.

According to a further aspect of the present disclosure, the predetermined threshold is two program-verify iterations.

According to yet a further aspect of the present disclosure, during the verify portion of the at least one program-verify iteration, a first verify pulse at the second verify low voltage VL2 is applied to the control gate of the selected word line and a second verify pulse at the verify high VH voltage is applied to the control gate of the selected word line.

According to still a further aspect of the present disclosure, the discharge time is a time it takes the sense node to discharge from a charged voltage V_charged to a sense voltage V_sense and wherein the step of determining the threshold voltage of the at least one memory cell includes comparing the discharge time to a first sensing time T_Sense_VL1 associated with the first verify low voltage VL1, to a second sensing time T_Sense_VL2 associated with the second verify low voltage VL2, and to a third sensing time T_Sense_VH associated with the verify high voltage VH.

According to another aspect of the present disclosure, the threshold voltage of the at least one memory cell is determined to be below the first verify low voltage VL1 in response to the discharge time being less than the first sensing time T_Sense_VL1; is determined to be between the first and second verify low voltages VL1, VL2 in response to the discharge time being between the first and second sensing time T_Sense_VL1, T_Sense_VL2; is determined to be between the second verify low voltage VL2 and the verify high voltage VH in response to the discharge time being between the second and third sensing times T_Sense_VL2, T_Sense_VH; and is above the verify high voltage VH in response to the discharge time being greater than the third sensing time T_Sense_VH.

Another aspect of the present disclosure is related to a memory device that includes an array of memory cells arranged in a plurality of word lines. The memory device further includes a controller that is configured to program the memory cells of a selected word line of the plurality of word lines in a plurality of program-verify iterations. During a verify portion at least one of the program-verify iterations, the controller is further configured to determine a threshold voltage of at least one memory cell of the selected word line relative to a first verify low voltage VL1, a second verify low voltage VL2, and a verify high voltage VH associated with a data state being programmed. During the verify portion of the program-verify iteration, the controller is also configured to maintain a count of program-verify iterations since the at least one memory cell passed a verify high voltage of a previously programmed data state or is configured to discharge a sense node through a channel including the at least one memory cell and compare a discharge time to predetermined sense times associated with the first and second verify low voltages and with the verify high voltage.

According to another aspect of the present disclosure, the controller is further configured to apply a programming pulse to a control gate of the selected word line and apply a first quick pass write (QPW) voltage to at least one bit line coupled with the at least one memory cell in response to a determination in a previous program-verify iteration that the threshold voltage of the at least one memory cell is between the first and second verify low voltages VL1, VL2; and apply a second QPW voltage to the at least one bit line coupled with the at least one memory cell in response to a determination in a previous program-verify iteration that the threshold voltage of the at least one memory cell is between the second verify low voltage VL2 and the verify high voltage VH, and wherein the second QPW voltage is greater than the first QPW voltage.

According to yet another aspect of the present disclosure, the controller is configured to apply no biasing voltage to the at least one bit line coupled with the at least one memory cell in response to a determination in a previous program-verify iteration that the at least one memory cell has a threshold voltage that is less than the first verify low voltage VL1.

According to still another aspect of the present disclosure, the controller is configured to determine that the threshold voltage of the at least one memory cell is between the first verify low voltage VL1 and the second verify low voltage VL2 in response to the count of program-verify iterations since the at least one memory cell passed verify high of the previous data state being above a predetermined threshold.

According to a further aspect of the present disclosure, the predetermined threshold is two program-verify iterations.

According to yet a further aspect of the present disclosure, during the verify portion of the at least one program-verify iteration, the controller is configured to apply a first verify pulse at the second verify low voltage VL2 to the control gate of the selected word line and to apply a second verify pulse at the verify high VH voltage to the control gate of the selected word line.

According to still a further aspect of the present disclosure, the discharge time is a time it takes the sense node to discharge from a charged voltage V_charged to a sense voltage V_sense and wherein to determine the threshold voltage of the at least one memory cell, the controller compares the discharge time to a first sensing time T_Sense_VL1 associated with the first verify low voltage VL1, to a second sensing time T_Sense_VL2 associated with the second verify low voltage VL2, and to a third sensing time T_Sense_VH associated with the verify high voltage VH.

According to another aspect of the present disclosure, the controller determines the threshold voltage to be below the first verify low voltage VL1 in response to the discharge time being less than the first sensing time T_Sense_VL1; the controller determines the threshold voltage to be between the first and second verify low voltages VL1, VL2 in response to the discharge time being between the first and second sensing time T_Sense_VL1, T_Sense_VL2; the controller determines the threshold voltage to be between the second verify low voltage VL2 and the verify high voltage VH in response to the discharge time being between the second and third sensing times T_Sense_VL2, T_Sense_VH; and the controller determines the threshold voltage to be above the verify high voltage VH in response to the discharge time being greater than the third sensing time T_Sense_VH.

Yet another aspect of the present disclosure is related to a method of programming a memory device. The method includes the step of preparing a memory device that includes an array of memory cells arranged in a plurality of word lines. The method continues with the step of programming the memory cells of a selected word line of the plurality of word lines in a plurality of program-verify iterations. During a verify portion of at least one program-verify iteration of the plurality of program-verify iterations, the method proceeds with the steps of charging a sense node SEN to a charged voltage V_charged. The method then continues with the step of concurrently discharging the sense node SEN from the charged voltage V_charged to a sense voltage V_sense through a first set of channels coupled with at least one memory cell that is being programmed to a programmed data state N while a first biasing voltage is applied to at least one bit line coupled with the first set of channels and discharging the sense node SEN through a second set of channels coupled with at least one memory cell that is being programmed to a next programmed data state N+1 while a second biasing voltage that is different than the first biasing voltage is applied to at least one bit line coupled with the second set of channels. The method then proceeds with the step of comparing a discharge time of the sense node SEN from V_charged to V_sense through the first set of channels to a first predetermined sense time T_Sense_VH_N to determine if a threshold voltage of the at least one memory cell being programmed to the data state N has passed a verify high voltage VH of the data state N. The method then continues with the step of comparing a discharge time of the sense node SEN from V_charged to V_sense through the second set of channels to a second predetermined sense time T_Sense_VL_N+1 to determine if a threshold voltage of the at least one memory cell being programmed to the data state N+1 has passed a verify low voltage VL of data state N+1.

According to another aspect of the present disclosure, the second biasing voltage is greater than the first biasing voltage.

According to yet another aspect of the present disclosure, the first predetermined sense time T_Sense_VH_N is different than the second predetermined sense time T_Sense_VL_N+1.

According to still another aspect of the present disclosure, the method further includes the step of applying a programming pulse to a control gate of the selected word line and applying a QPW voltage to a bit line coupled to at least one memory cell that is determined to have a threshold voltage above a verify low voltage VL and below the verify high voltage VH of data state N to slow programming of the at least one memory cell.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 12A depicts the threshold voltage of a memory cell through a plurality of program-verify where a QPW zone is too small;

FIG. 12B depicts the threshold voltage of a memory cell through a plurality of program-verify where a QPW zone is too large;

DETAILED DESCRIPTION

As discussed in further detail below, the present disclosure is related to programming techniques which allow for dual zone QPW programming to be conducted more quickly by reducing verify time. In other words, the benefits of dual zone QPW programming (specifically, improved reliability in the form of tighter threshold voltage distributions) are realized without the performance penalty that normally comes with dual zone QPW programming.

Figure 1A:
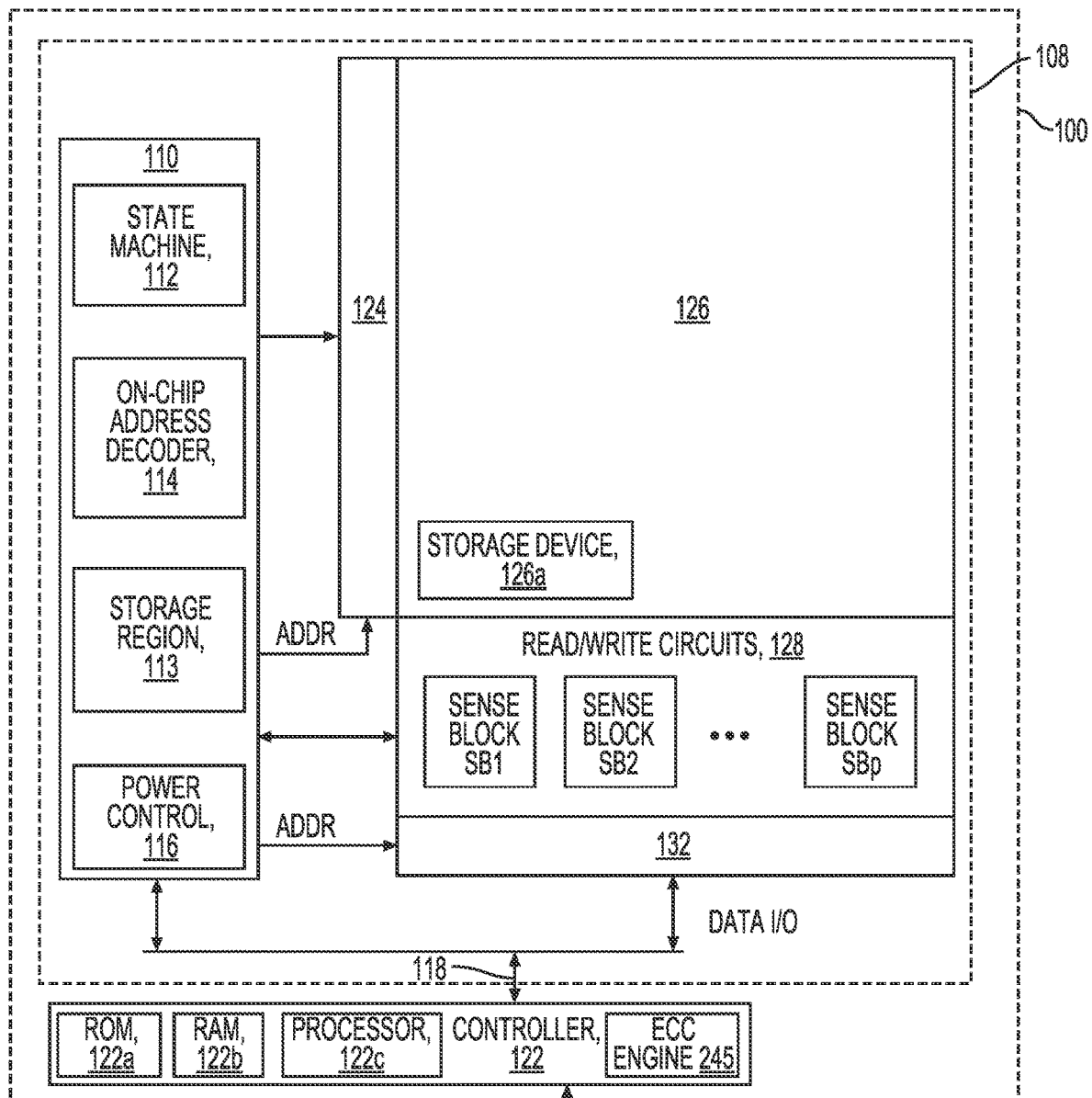
FIG. 1A is a block diagram of an example memory device.

FIG. 1A is a block diagram of an example memory device that is capable of conducting the aforementioned programming techniques. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
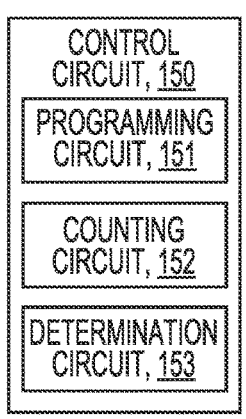
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
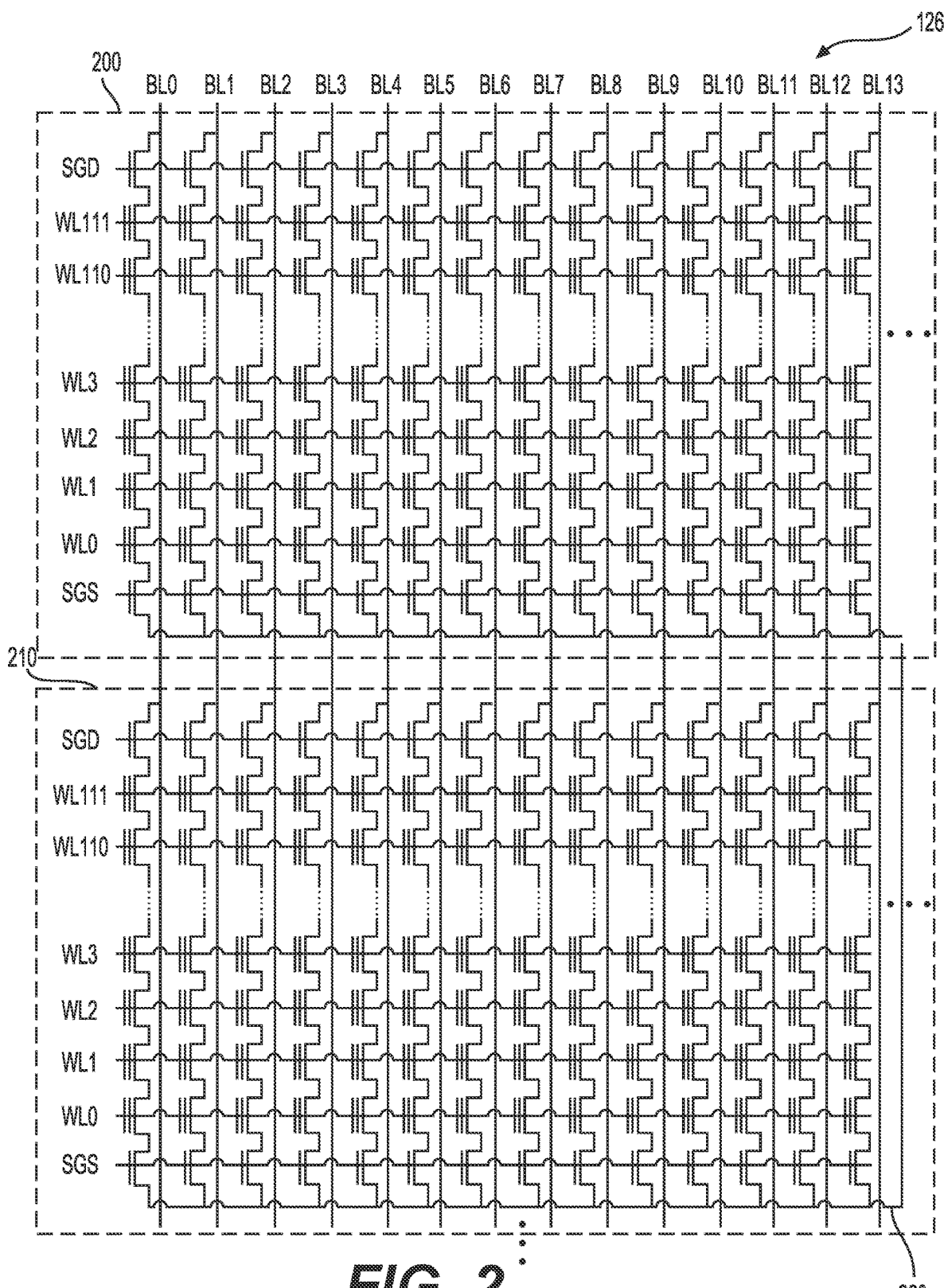
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
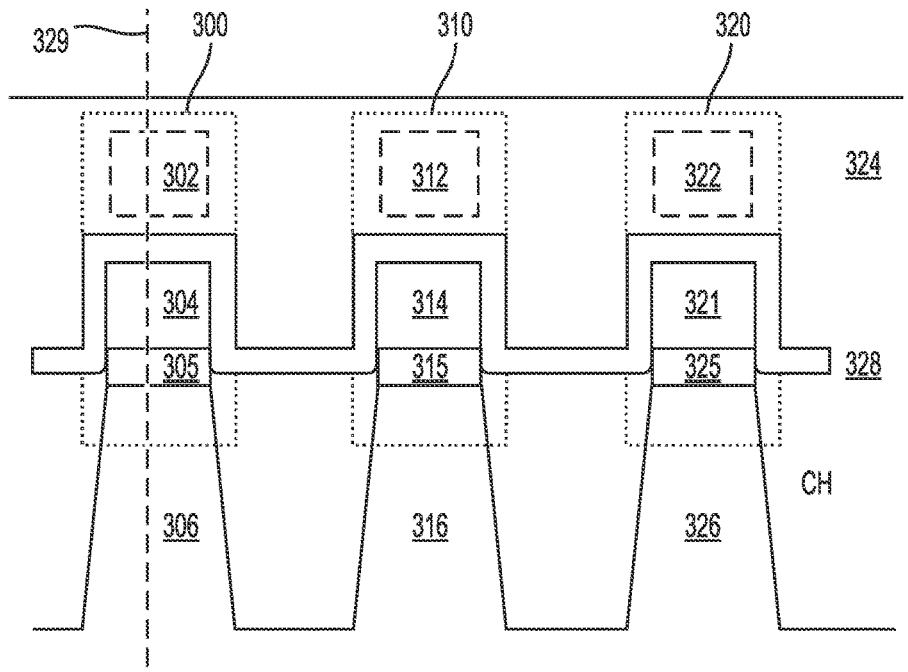
FIG. 3A and FIG. 3B depict cross-sectional views of example floating gate memory cells in NAND strings.
Figure 3B:
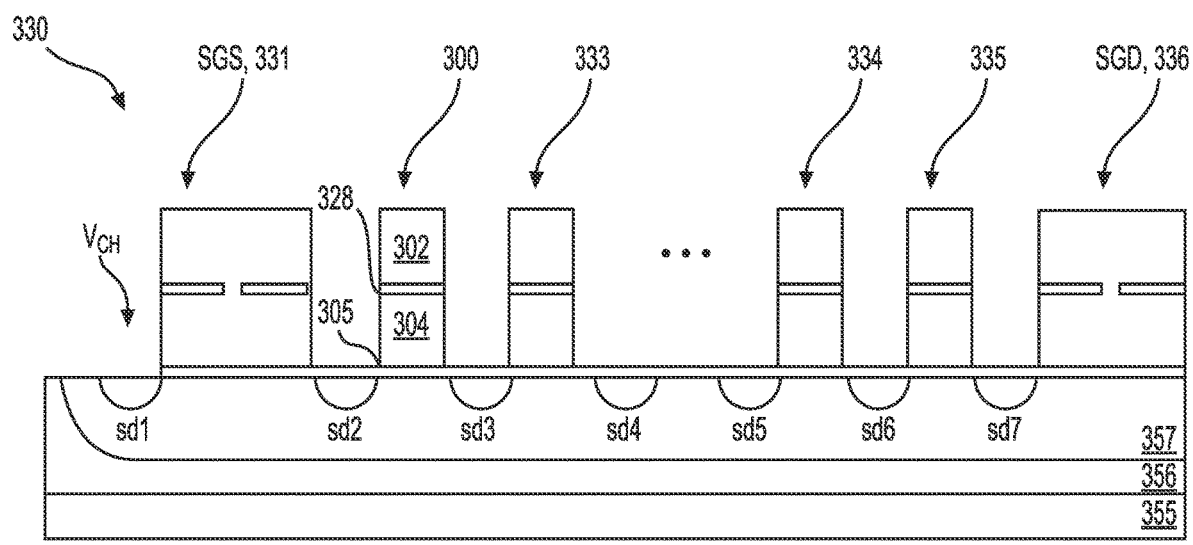

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
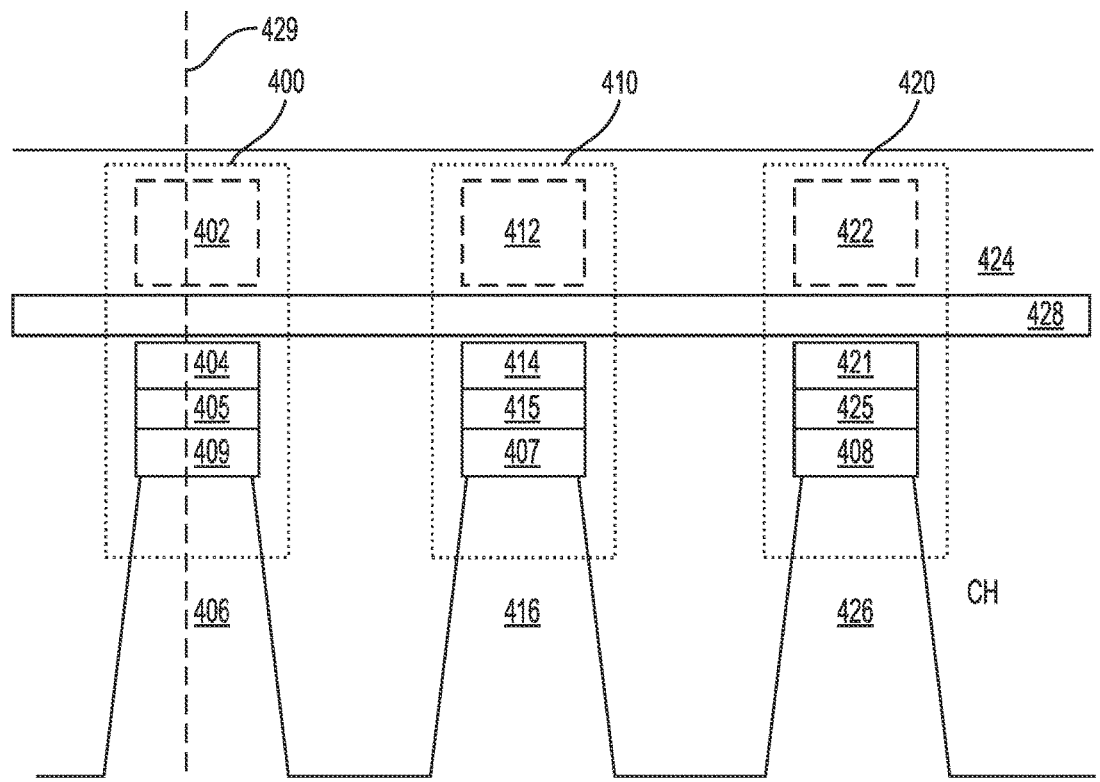
FIG. 4A and FIG. 4B depict cross-sectional views of example charge-trapping memory cells in NAND strings.
Figure 4B:
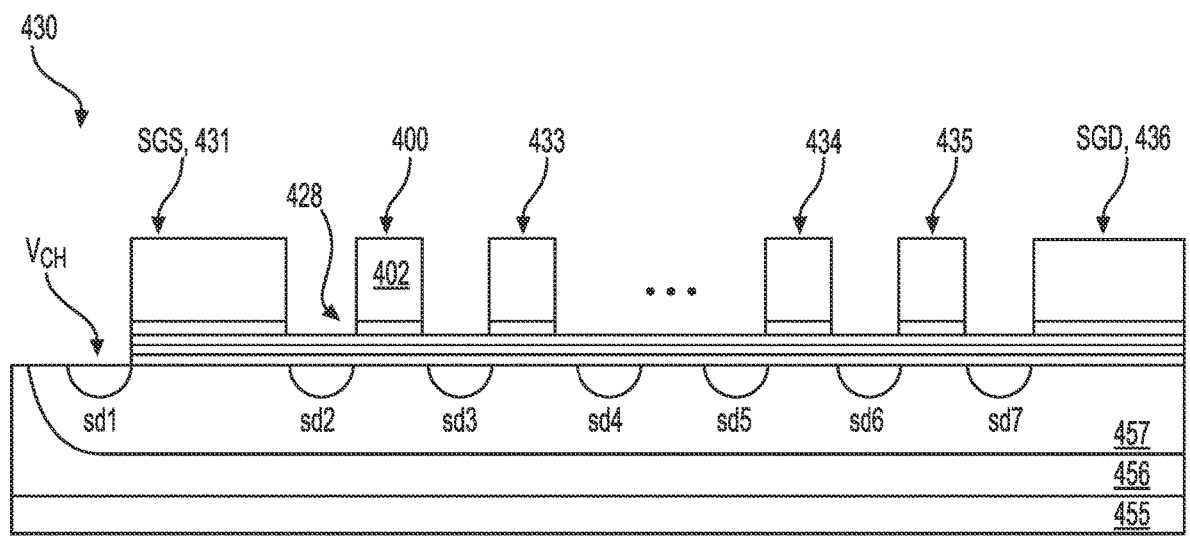

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . , 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
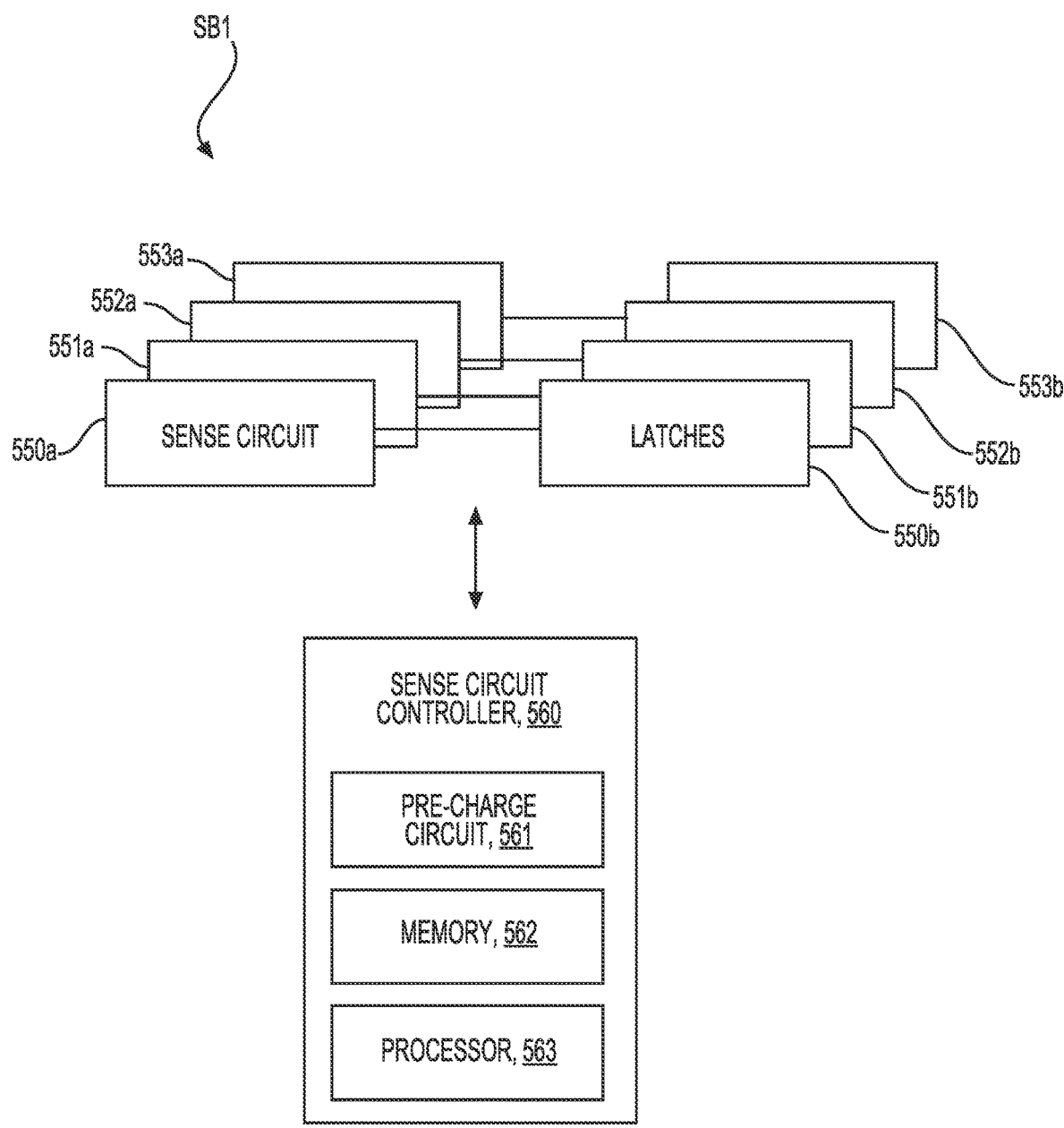
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
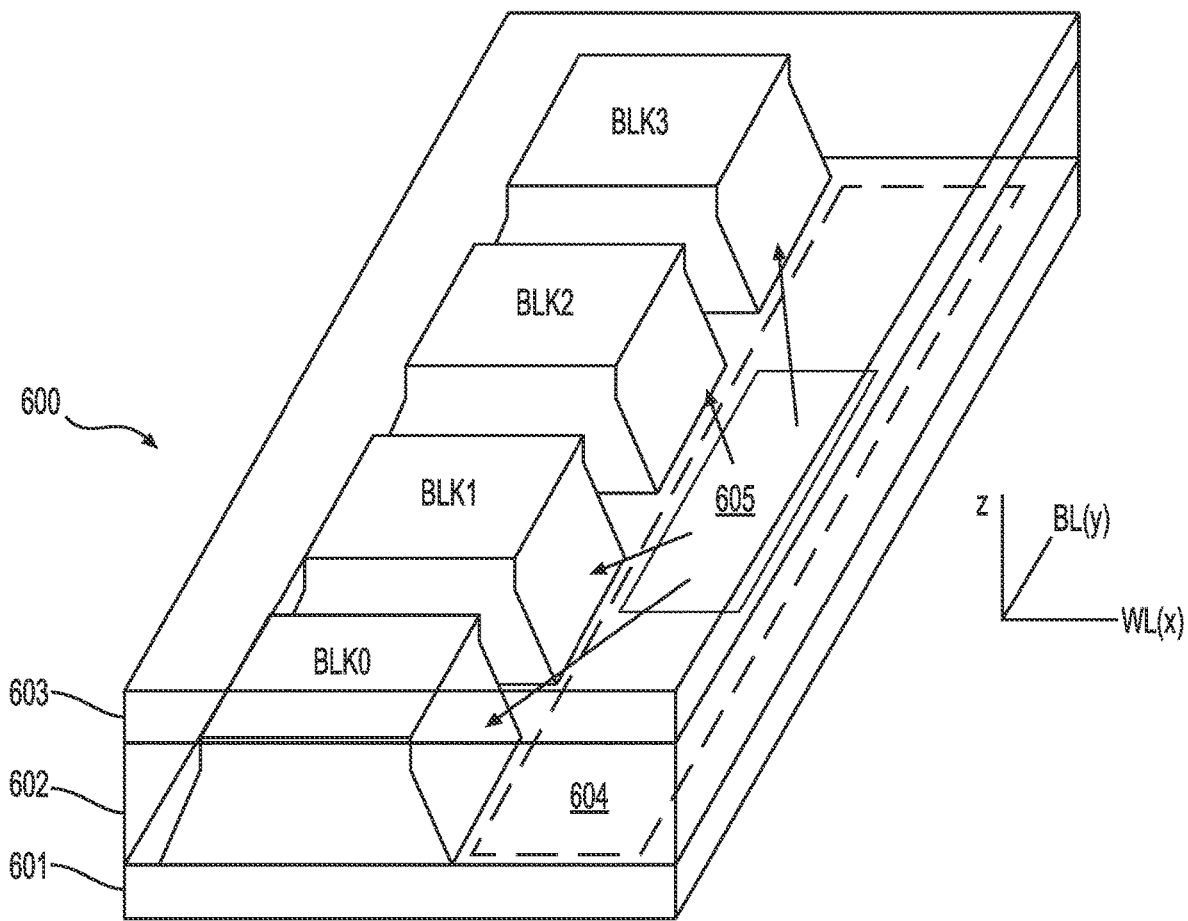
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
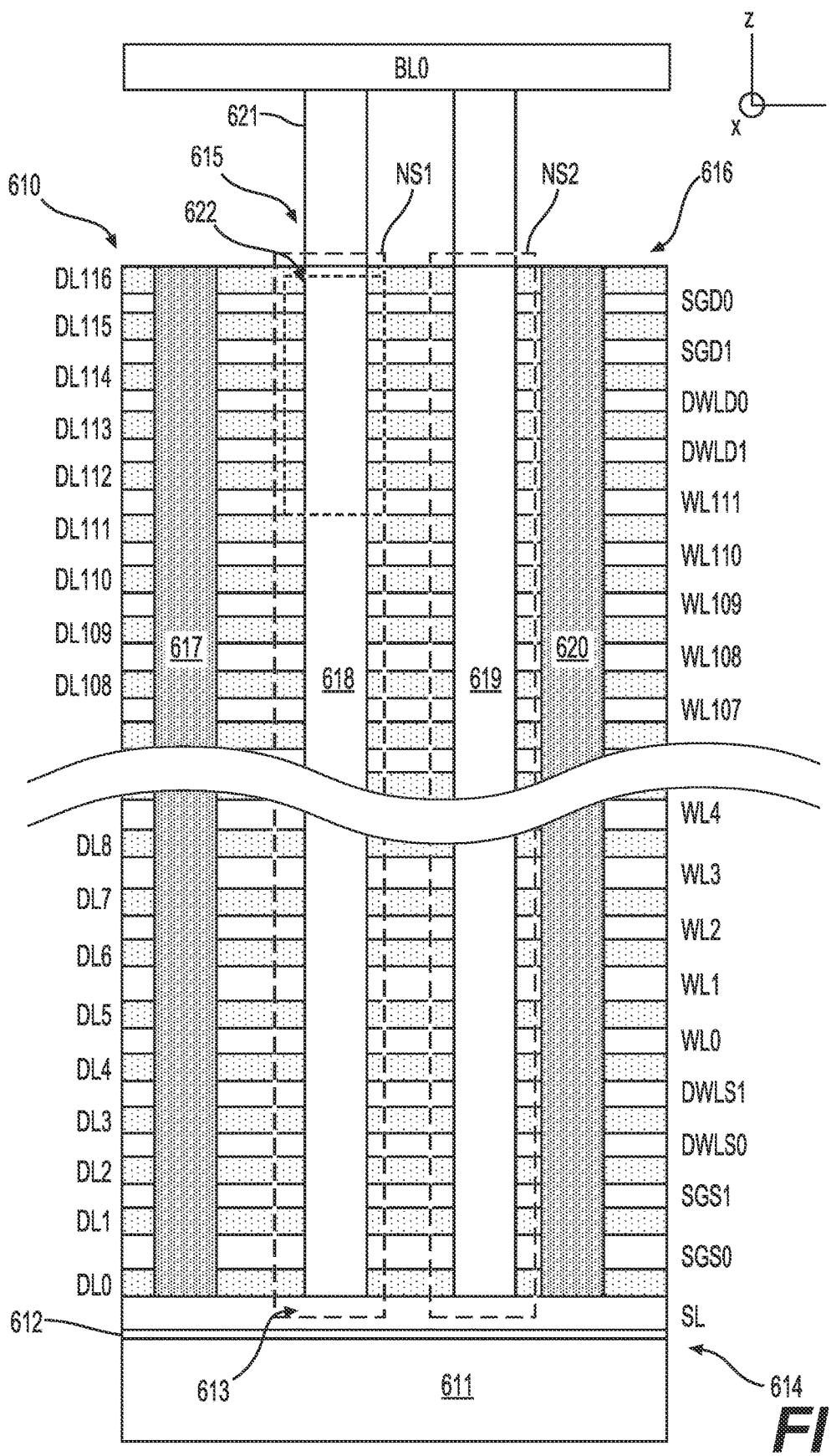
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
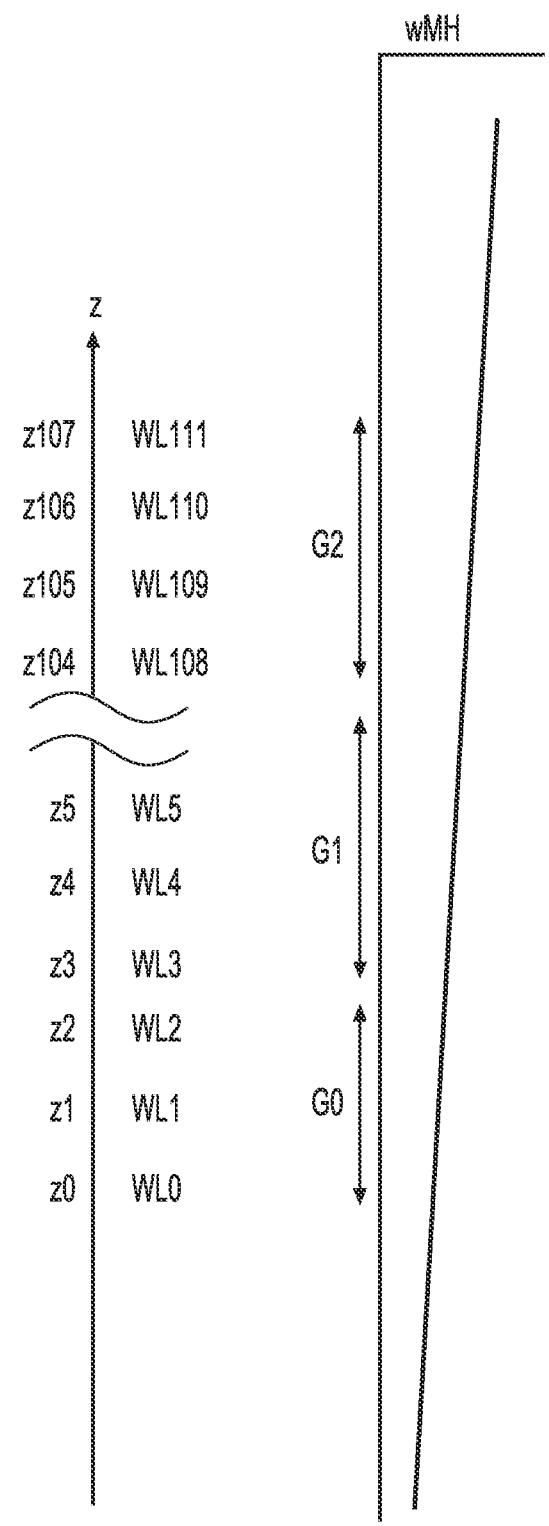
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
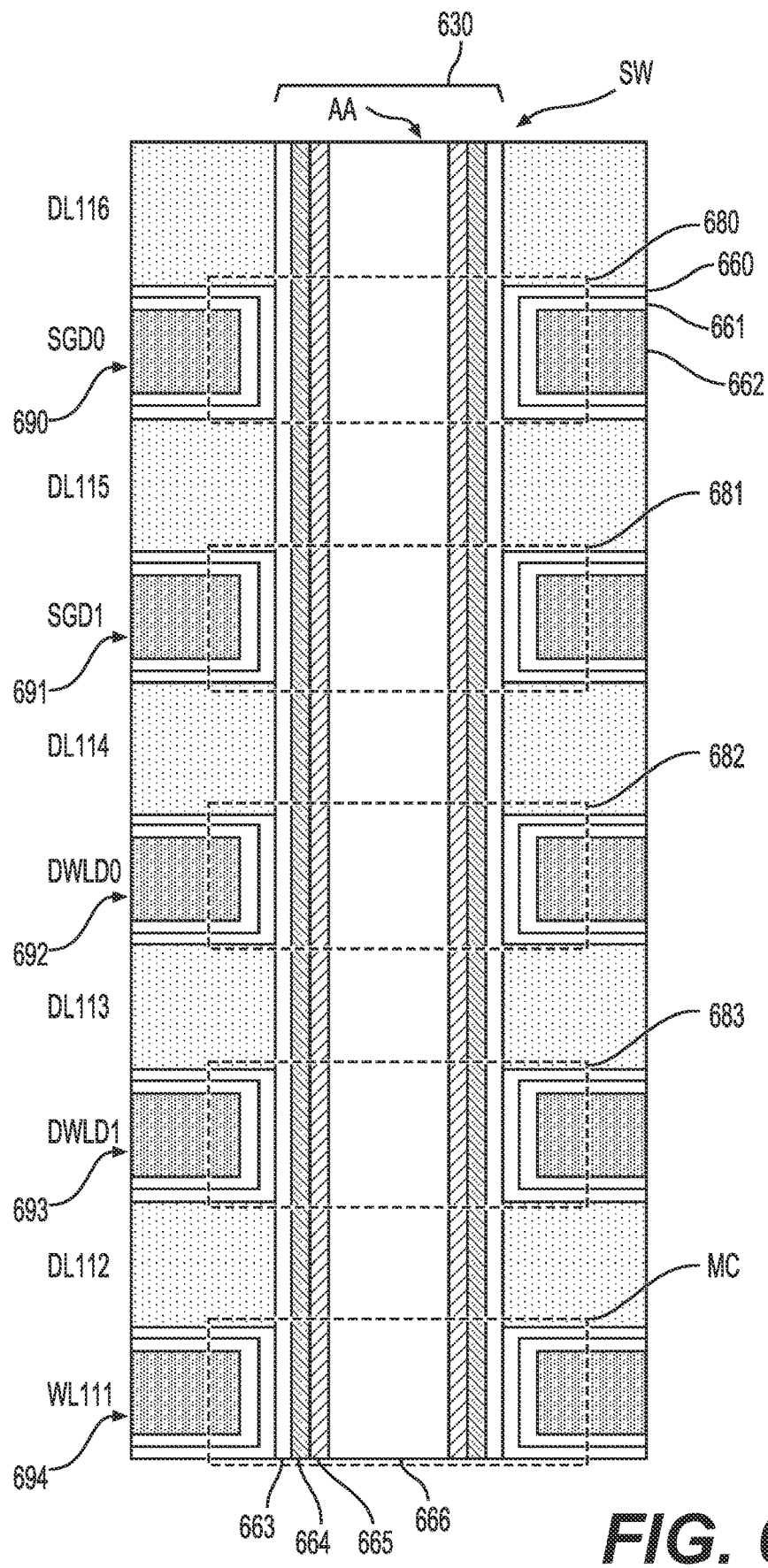
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
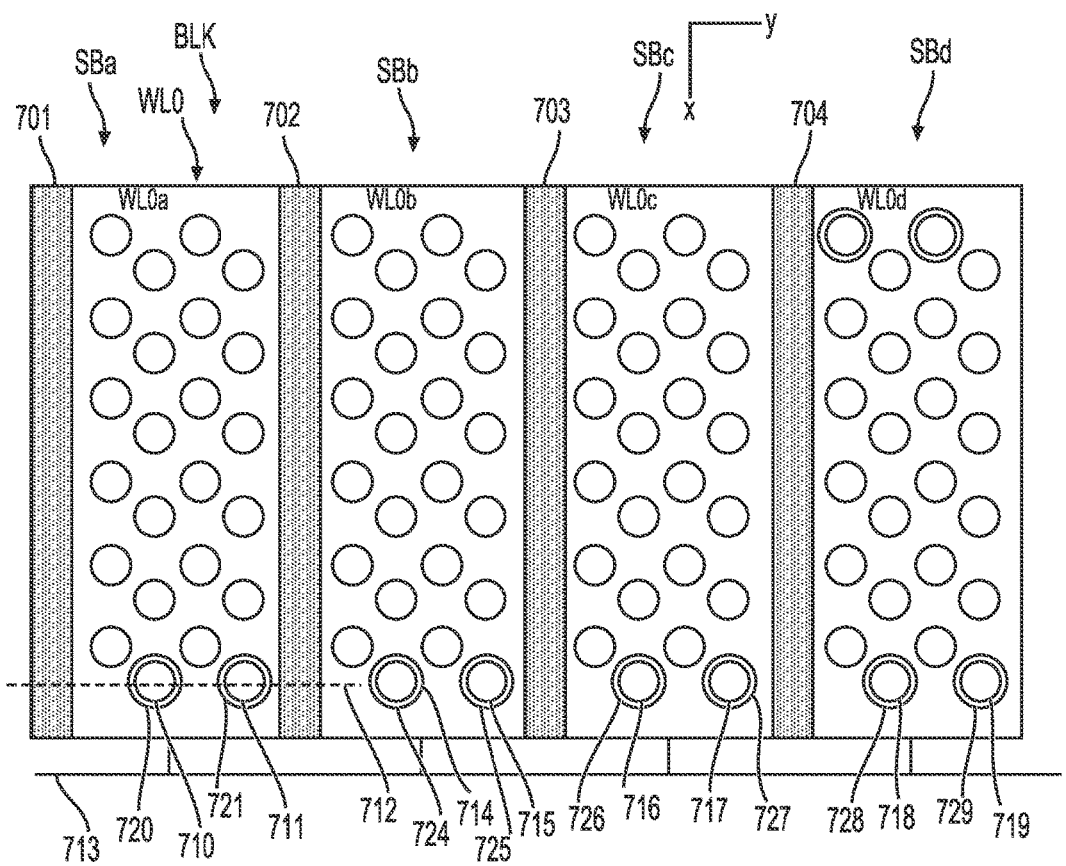
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
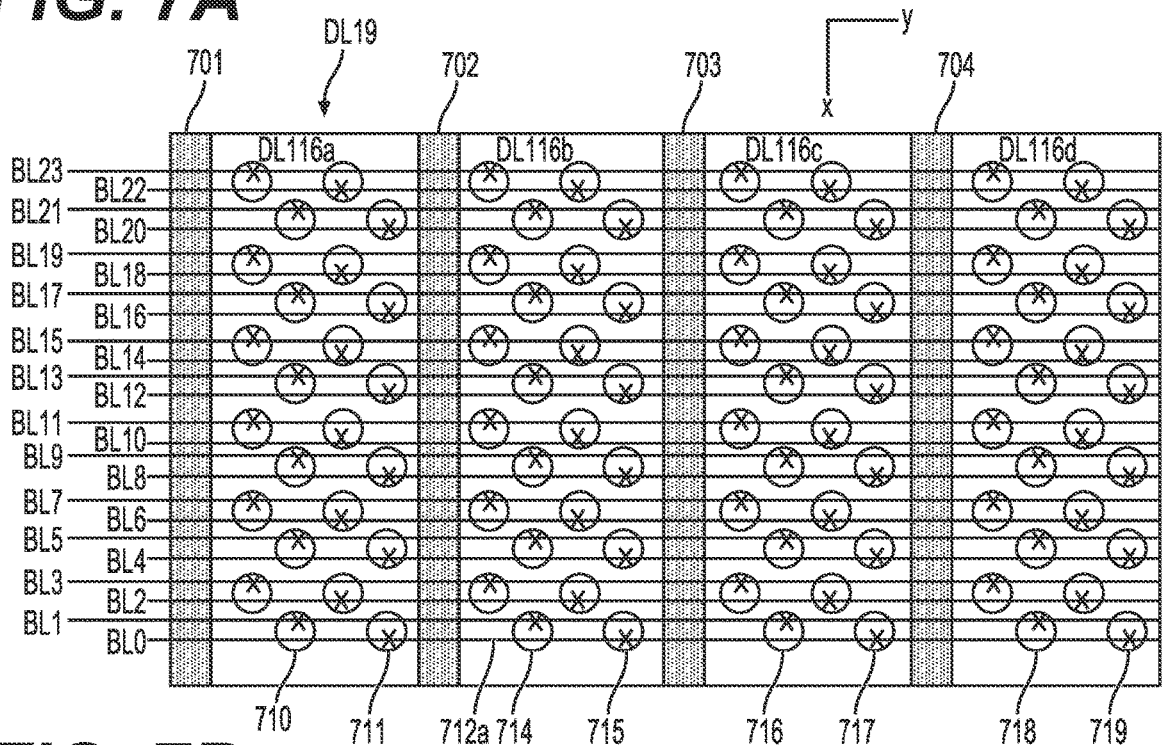
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
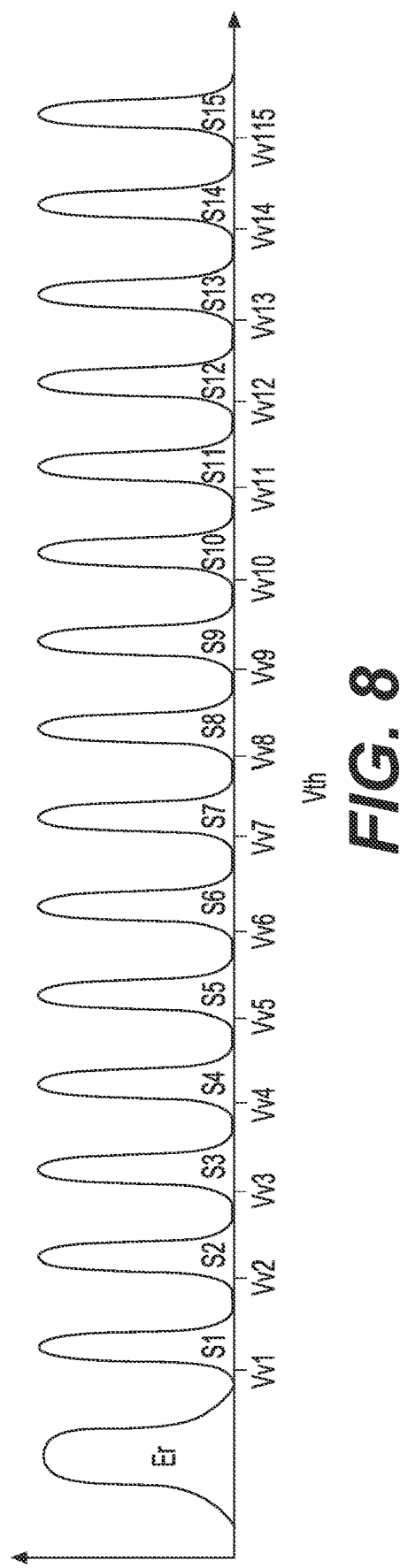
FIG. 8 depicts an exemplary voltage distribution of a plurality of memory cells programmed to four bits of data per memory cell (QLC)

In many memory device, the memory cells are configured to store multiple bits of data in each memory cell, e.g., two bits per memory cell (MLC), three bits per memory cell (TLC), or four bits per memory cell (QLC). To store multiple bits of data in individual memory cells, the memory cells are programmed to predetermined threshold voltages, or data states, which are associated with certain combinations of bits of data. FIG. 8 depicts an exemplary threshold voltage distribution of a plurality of memory cells programmed to four bits of data (QLC). As shown, the threshold voltage distribution includes sixteen total data states, including an erased data state (Er) and fifteen programmed data states (S1-S15) with each programmed data state S1-S15 being associated with a respective verify voltage Vv1-Vv15. TLC includes the erased data state (Er) and seven programmed data states (S1-S7), and MLC includes the erased data state (Er) and three programmed data states (S1-S3).

A programming operation to program the memory cells of a selected word line to the desired data states begins with the memory cells being provided in the erased state (Er). Next, one or more programming-verify iterations are performed on the selected word line with each program-verify iteration including a programming pulse and one or more verify pulses applied to a control gate of the selected word line. As the verify pulse is applied to the selected word line, the controller senses whether a memory cell conducts or does not conduct current to determine if the memory cell has reached its desired threshold voltage, or programmed data state. Once a memory cell has reached its desired data state, an inhibit voltage can be applied to a memory hole including that memory cell to inhibit further programming during later program-verify iterations while the other memory cells of the selected word line continue to be programmed to their respective programmed data states.

Figure 9:
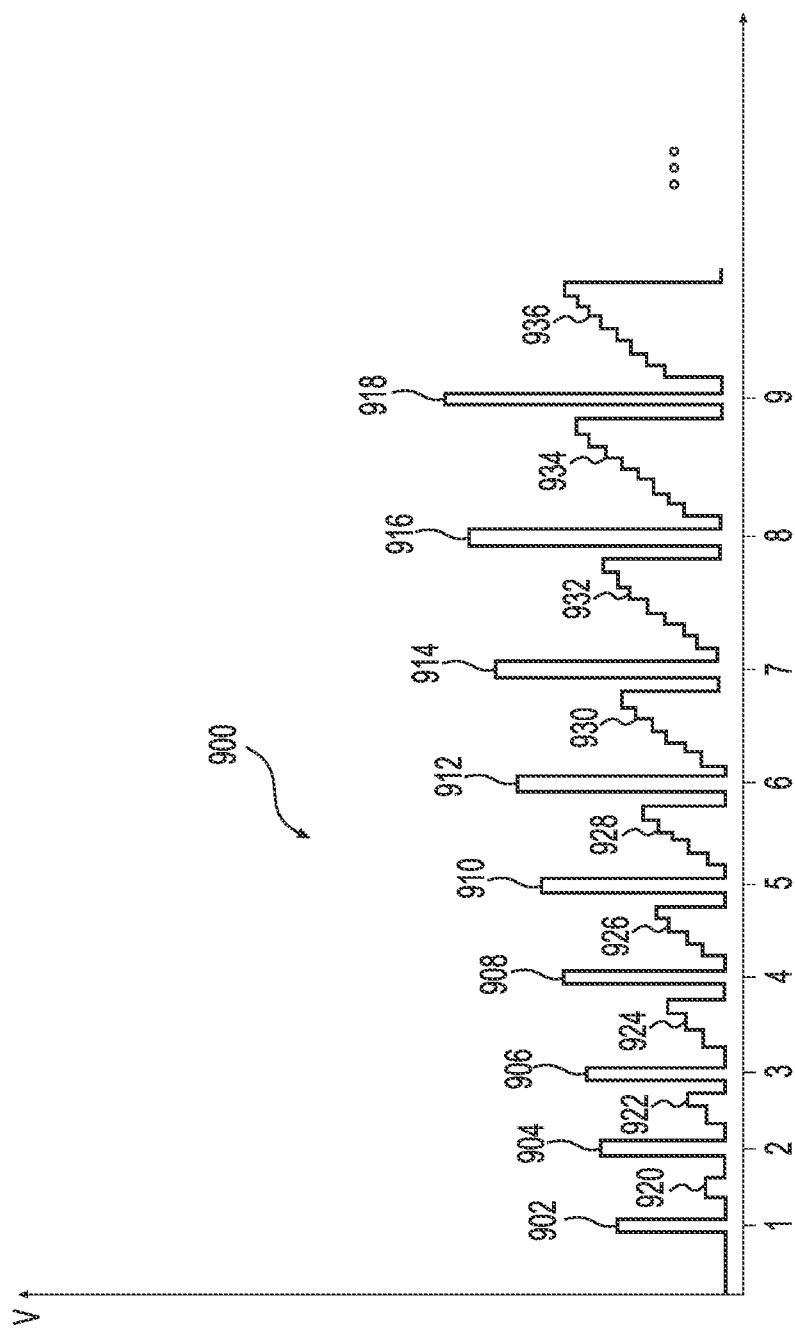
FIG. 9 depicts a waveform of the voltages applied to a control gate of a selected word line during an exemplary programming operation.

FIG. 9 depicts a waveform 900, or pulse train, of an example programming operation. The horizontal axis depicts time, and the vertical axis depicts control gate or word line voltage through multiple program-verify iterations. A square waveform is depicted for each programming pulse and each verify pulse for simplicity; however, other shapes are possible, such as a multilevel shape or a ramped shape. Further, Incremental Step Pulse Programming (ISPP) is used in this example, in which the programming (Vpgm) pulse 902-918 amplitude steps up in each successive program loop by a fixed increment amount, e.g., dVpgm.

A pulse train starts at an initial Vpgm pulse level and ends at a final Vpgm pulse level, which does not exceed a maximum allowed level. The pulse train 900 includes a series of Vpgm pulses 902, 904, 906, 908, 910, 912, 914, 916, 918 . . . that are applied to the control gate of the selected word line. One, two, three, or more verify voltage pulses 920-936 are provided after each Vpgm pulse 902-918 as an example, based on the target memory states which are being verified in each program-verify iteration. A voltage of 0 V may be applied to the control gate of the selected word line between the Vpgm pulses and verify voltage pulses.

Figure 10:
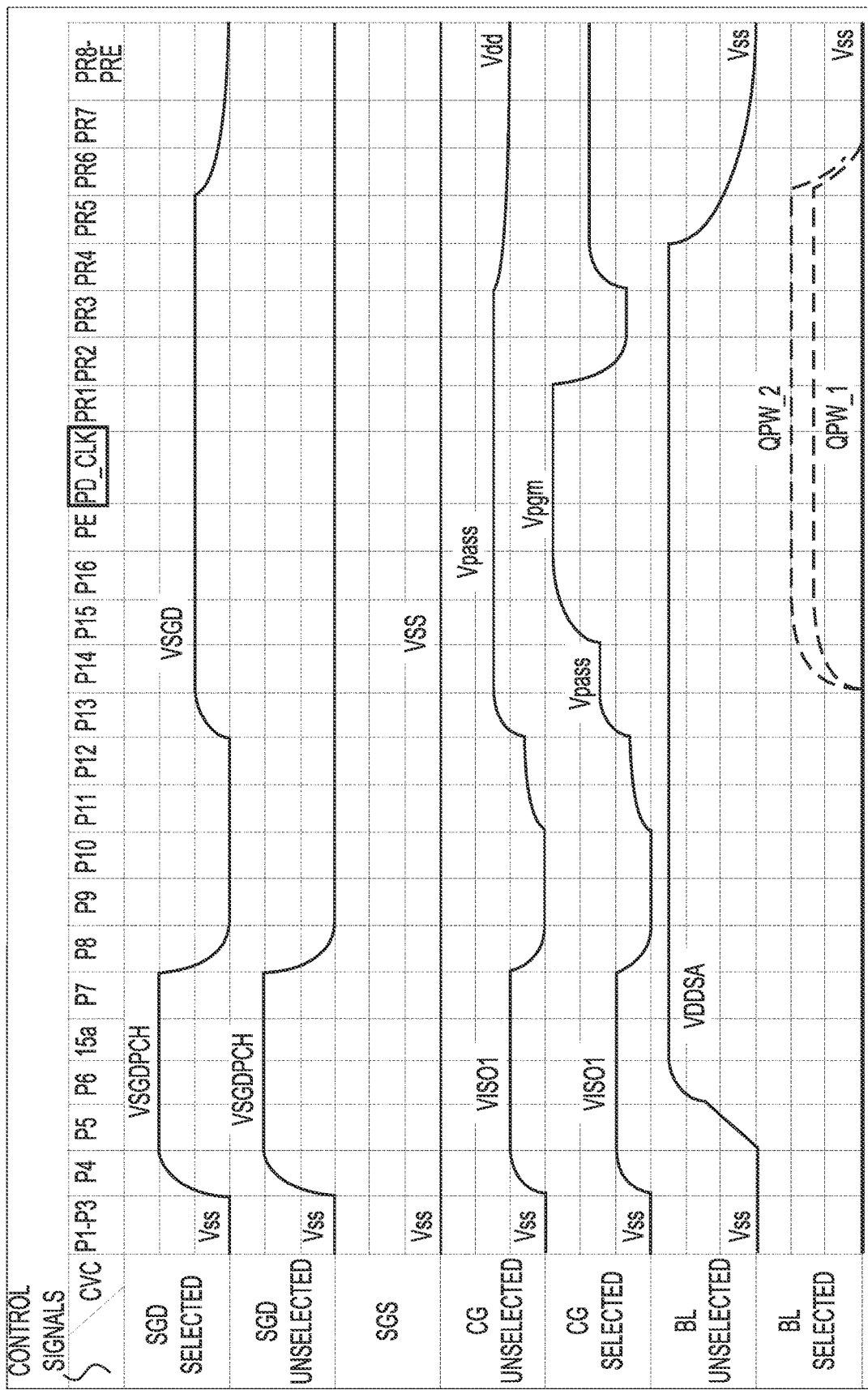
FIG. 10 depicts the voltages applied to various components of the memory device during an exemplary programming operation.

There is a continuing need to develop programming techniques which tighten the threshold voltage distributions of the programming data states in order to improve programming reliability but to do so in such a way that the improved reliability does not come at the expense of performance, i.e., programming time. One such programming technique is known as Quick Pass Write (QPW), which slows programming of the memory cells that have passed a verify low VL voltage but have not passed a verify high VH voltage for a given data state. As illustrated in FIG. 10, to slow programming, during the application of a Vpgm pulse to the control gate of a selected word line, a QPW voltage (QPW_1 or QPW_2) is applied to the bit lines coupled to the memory cells that have passed a verify low (VL) voltage associated with a programmed data state (e.g., data state S1). The QPW voltage increases the voltage in the channels containing the memory cells for which slow programming is desired, thereby reducing the voltage difference between the programming pulse Vpgm and the channels and slowing the flow of electrons into the charge trapping materials of the memory cells being programmed. Any memory cell which passes a verify high (VH) voltage is then locked down, or inhibited, from further programming by applying an inhibit voltage VDDSA to the bit lines coupled to those memory cells during subsequent Vpgm pulses.

Figure 11:
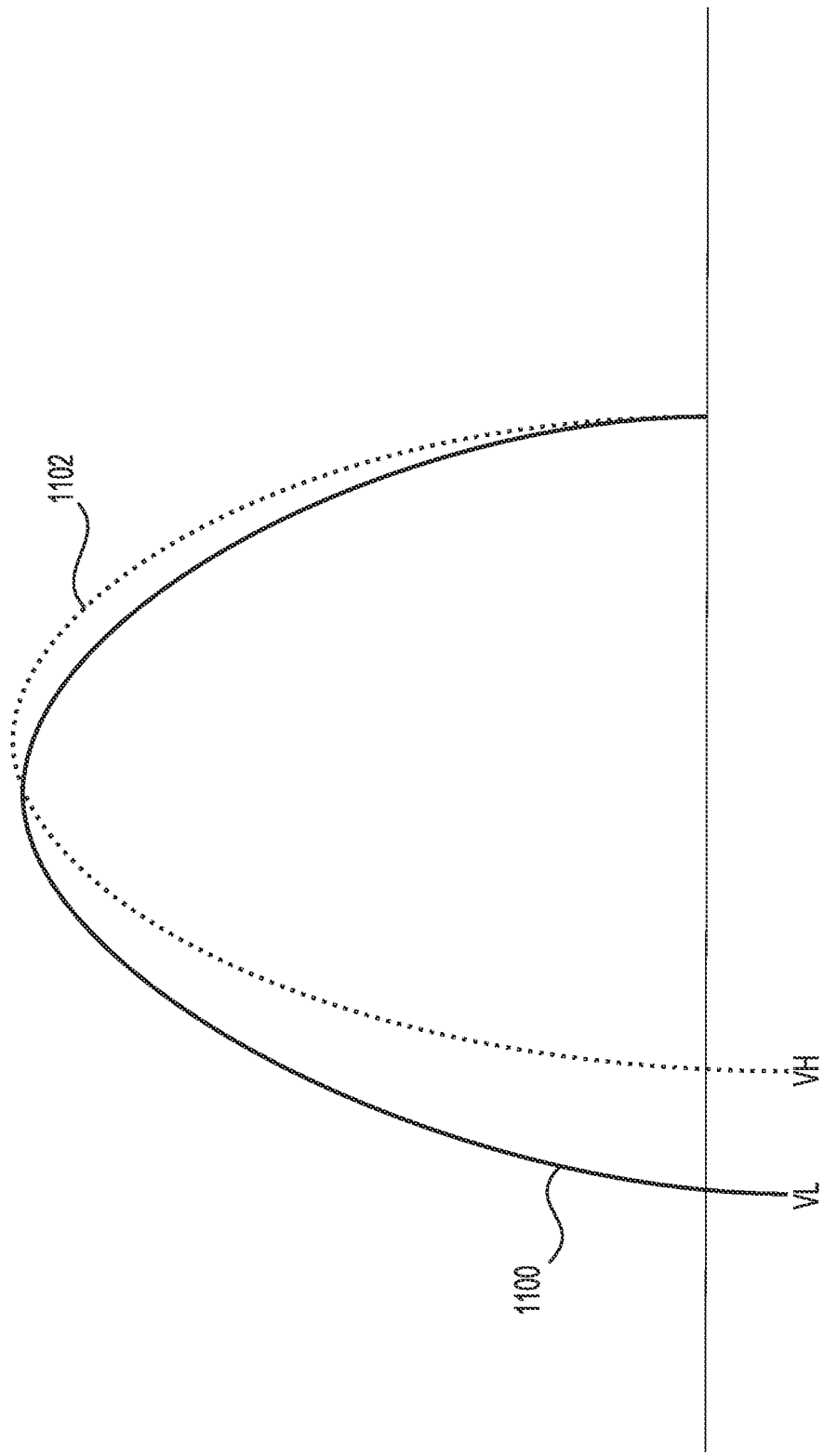
FIG. 11 depicts the threshold voltage distribution of the memory cells of a data state line before and after programming using a QPW programming technique.

Turning now to FIG. 11, shown are the Vt distributions of the memory cells being programmed to a given programmed data state (e.g., data state S1) at different points in a programming operation. Curve 1100 identifies the Vt distribution of the memory cells after a given programming pulse, and curve 1102 identifies the Vt distribution of the same memory cells after a subsequent programming pulse. As shown, in curve 1100, some of the memory cells fall between verify low VL and verify high VH and some of the memory cells fall above verify high VH. During the subsequent programming pulse, programming is inhibited for the memory cells that fall above verify high VH, and programming is slowed via QPW programming for the memory cells that fell between verify low VL and verify high VH. After the subsequent programming pulse, curve 1102 illustrates that the Vt distribution has been tightened, and all of the memory cells now fall above VH.

For QPW programming to be effective, the voltage gap between VL and VH should be maintained at an optimal level. If the voltage gap between VL and VH is too small, some memory cells may miss VL sensing and may be over-programmed, as shown in the plot of FIG. 12A with each point identifying the threshold voltage of a particular memory cell following a Vpgm pulse. On the other hand, QPW programming only slows programming for a few (for example, two or three) program-verify iterations. Therefore, if the gap is too large, then some memory cells might get back to non-QPW programming speeds even within the QPW zone between VL and VH, as shown in FIG. 12B. This also could lead to overprogramming. In many presently preferred embodiments, a memory cell receives the QPW biasing for programming for no more than two programming pulses.

Figure 13:
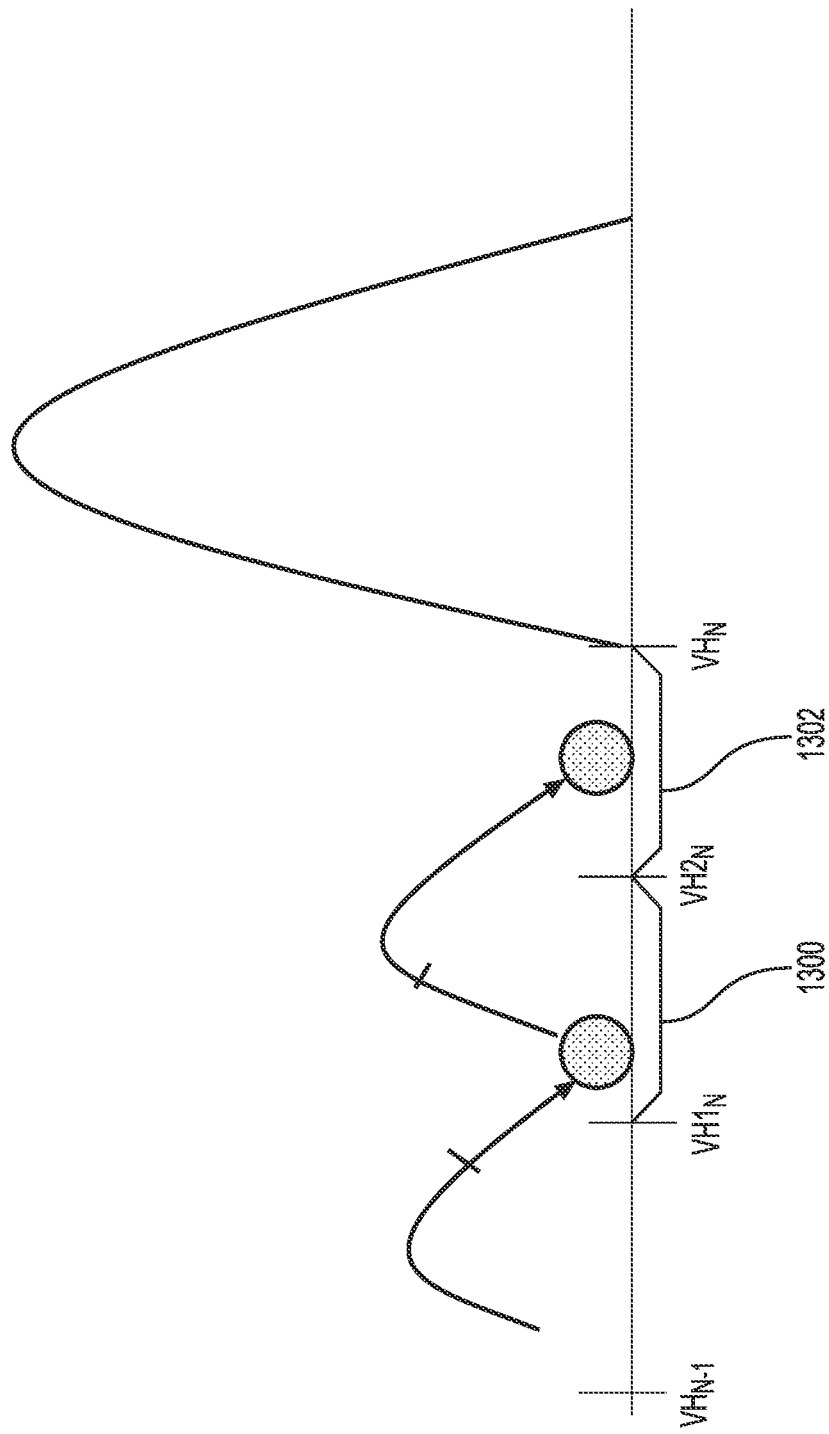
FIG. 13 depicts the threshold voltage of a memory cell through a plurality of program-verify with two QPW zones.

Turning now to FIG. 13, another QPW technique (herein referred to as "dual zone QPW") utilizes two QPW zones 1300, 1302 to even more precisely program the memory cells and further tighten the threshold voltage distributions of the programmed data states. Dual zone QPW programming also prevents the over-programming issues that could result if a memory cell remains in a single QPW zone for too many programming pulses. To accomplish this, the first zone 1300 is defined as the voltage range between a first verify low voltage VL1 and a second verify low voltage VL2, and the second zone 1302 is defined as the voltage range between the second verify low voltage VL2 and the verify high voltage VH. Memory cells below the first verify low voltage VL1 receive no QPW biasing voltage such that programming continues at the normal rate, memory cells in the first zone 1300 receive a first biasing voltage QPW_1 such that programming is slowed, and memory cells in the second zone 1302 receive a second biasing voltage QPW_2 that is greater than the first biasing voltage QPW_1 such that programming is slowed further.

According to some QPW techniques, two QPW verify pulses (plus the VH verify pulse), one each for VL1 and VL2, are applied to the memory cells following each programming pulse to detect which QPW zone the memory cells are in.

Figure 14:
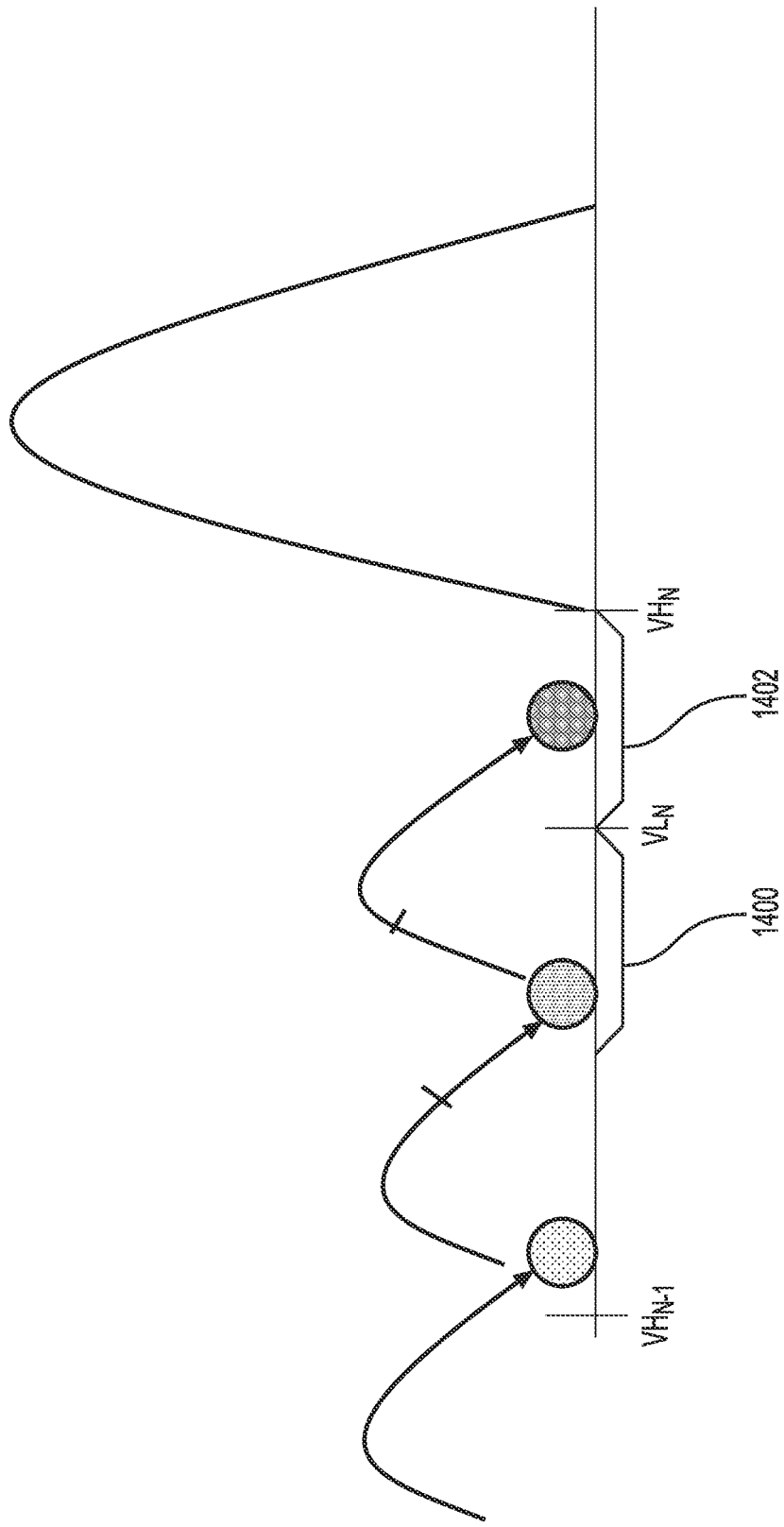
FIG. 14 depicts the threshold voltage of a memory cell through a plurality of program-verify with two QPW zones but where a programming technique of an exemplary embodiment is employed to determine when the memory cell is in a first of the two QPW zones.

Referring now to FIG. 14, an aspect of the present disclosure is related to a QPW technique that utilizes multiple zones but only with a single QPW verify pulse, as opposed to two QPW verify pulses as are found in other known techniques. According to these QPW techniques, verify of the verify high voltage (VH_N-1) of data state N-1 is utilized to first detect a memory cells' proximity to the only verify low voltage (VL_N) of data state N. Then, the controller waits for a predetermined number (one or more) of program-verify iterations before applying the QPW_1 biasing voltage to the memory cells that have passed VH_N-1. In other words, as soon as a memory cell is detected as crossing VH_N-1, a counter is turned on by a data latch, but programming otherwise continues without a QPW biasing voltage being applied to the memory cell. Then, after one or more counted programming pulses without the QPW biasing voltage, the memory cell is determined to be in the first QPW zone 1400 and a QPW_1 biasing voltage is applied to the memory cell to slow programming of the memory cell during a subsequent programming pulse. Upon detection that the memory cell is in the second QPW zone 1402 (it has crossed VL2 N but has not crossed VH_N), then the biasing voltage is increased from QPW_1 to QPW_2 to further slow programming of the memory cell for the following programming pulse(s) until the memory cell passes VH_N and further programming is inhibited.

Figure 15:
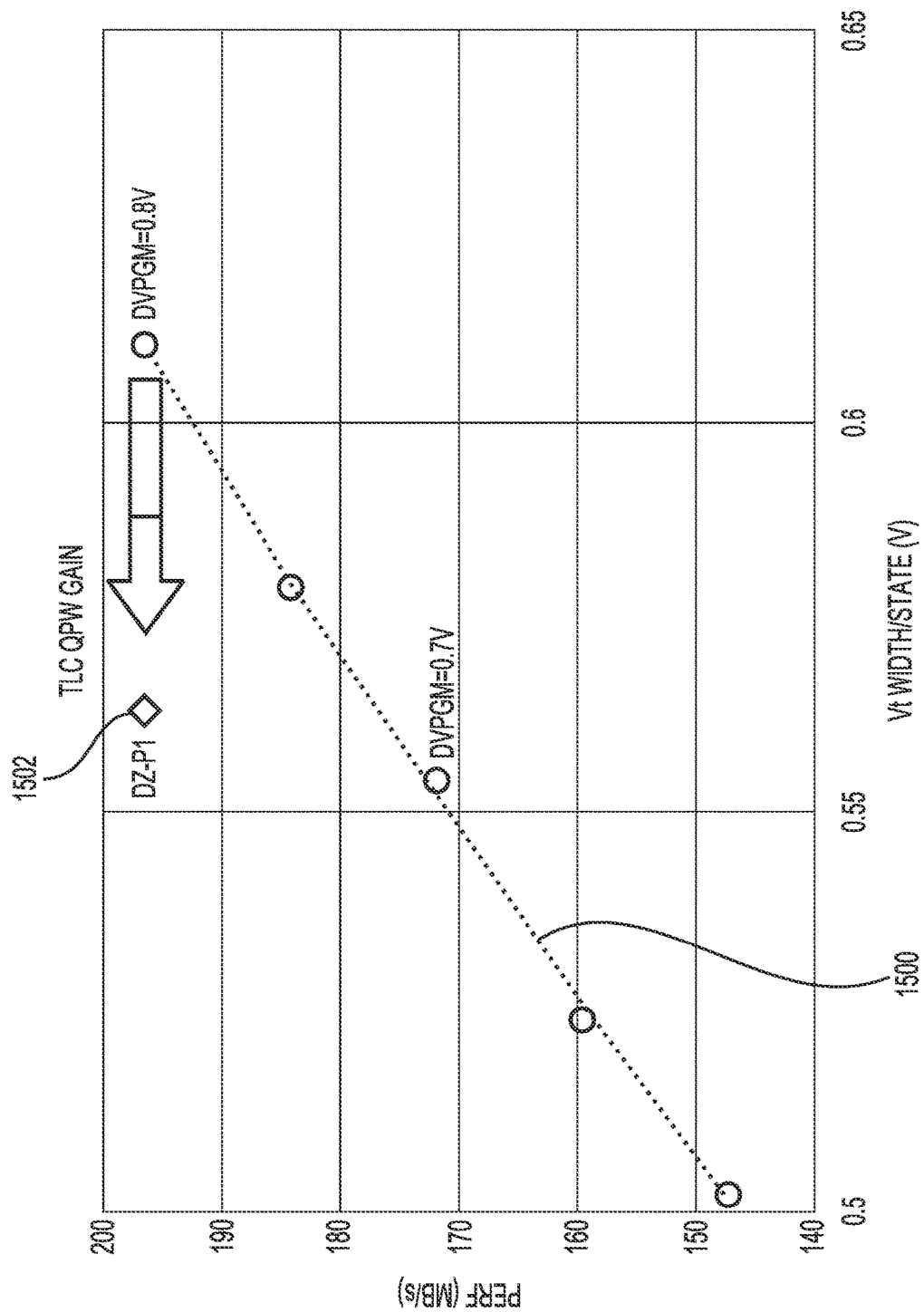
FIG. 15 depicts performance versus threshold voltage width for memory cells programmed using differing programming techniques.

These QPW techniques result in the improved reliability offered by dual zone QPW programming, as discussed above and illustrated in FIG. 13, but similar performance to a single zone QPW programming operation since only a single verify low verify pulse is required for each data state being verified during each program-verify iteration. Turning now to the plot of FIG. 15, as illustrated with line 1500, when a single-zone QPW programming operation is employed, there is a general trade-off between reliability, as measured with average threshold voltage VT width per data state, (the x-axis) and performance (the y-axis) by selecting the Vpgm incrementing voltage dVpgm. In other words, when using single-zone QPW programming, by selecting dVpgm, you can generally either choose high reliability but with lower performance, high performance but with lower reliability, or somewhere in-between. Point 1502 is one sample data point following programming using the dual-zone QPW programming techniques discussed herein. As illustrated, these techniques result in a significantly improved combination of reliability and performance. In simulations, these QPW programming techniques, at the same reliability, are equivalent to an approximately 9.2% performance gain or an approximately 252 mV VT margin improvement without a performance penalty.

Figure 21:
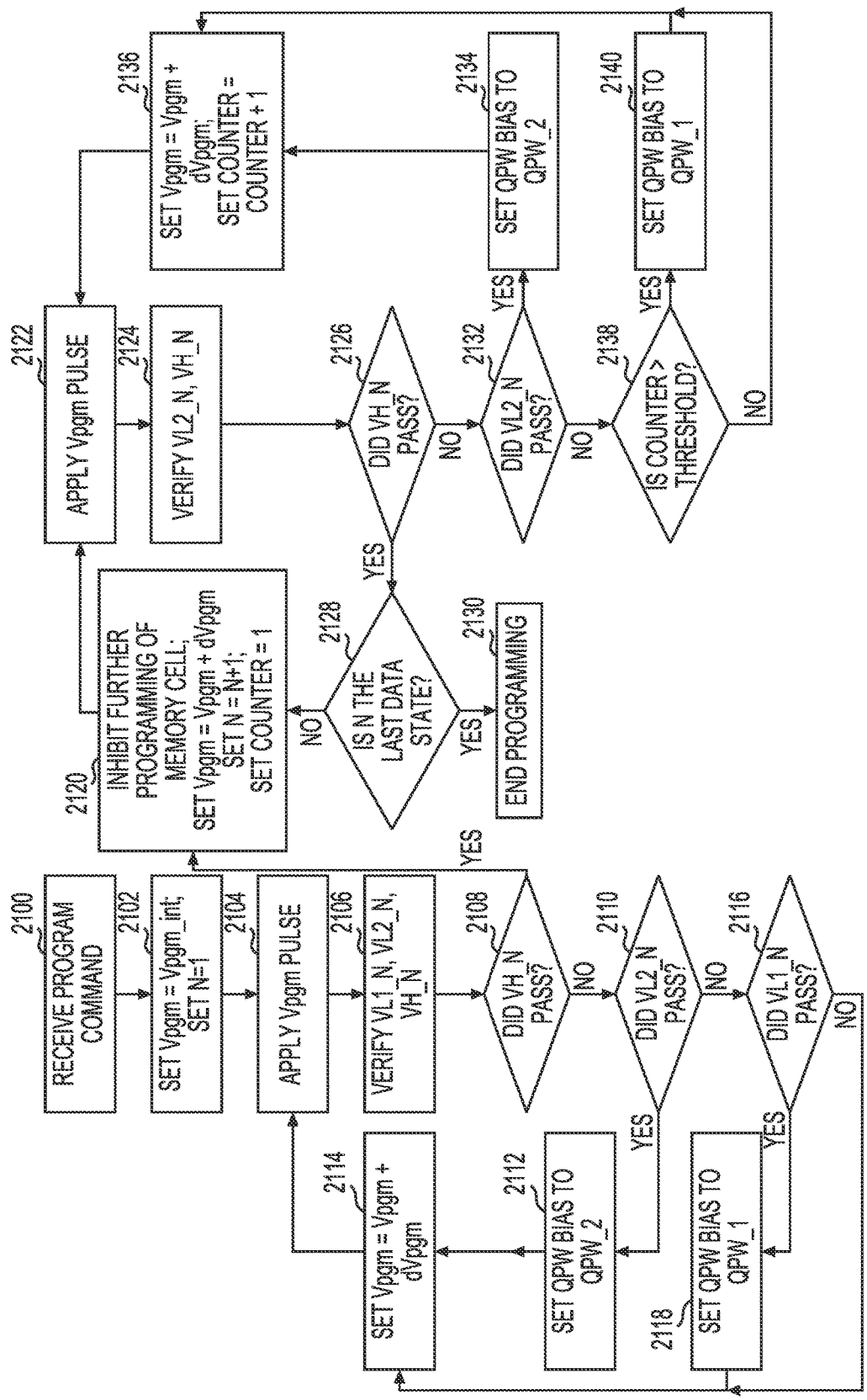
FIG. 21 is a flow chart depicting the steps of programming the memory cells according to one exemplary embodiment of the present disclosure.

Turning now to FIG. 21, a flow chart depicting the steps of an exemplary programming process is depicted. At step 2100, a programming command is received to program the memory cells of a selected word line. At step 2102, the programming voltage Vpgm is set to an initial value, Vpgm_int, and a data state being programmed N is set to one. At step 2104, a Vpgm pulse is applied to the control gate of the selected word line.

The following verify steps are performed on a memory cell-by-memory cell basis. During verify of a first programmed data state (such as data state S1), verify is performed on the memory cells being programmed to the first programmed data state for all of VL1, VL2, and VH at step 2106 (as discussed below, during programming of the following states, verify of VL1 is skipped).

At decision step 2018, it is determined if verify of VH_N has passed. If the answer at decision step 2108 is no, then the process proceeds to decision step 2110. At decision step 2110, it is determined if verify of VL2 N has passed. If the answer at decision step 2110 is yes, then at step 2112, the memory cell is in the second QPW zone, and a QPW bias level is set to QPW_2. At step 2114, the Vpgm voltage is incrementally increased, i.e., Vpgm=Vpgm+dVpgm. The process then returns to step 2104 to begin a next program-verify iteration.

If the answer at decision step 2110 is no, then the process proceeds to decision step 2116. At decision step 2116, it is determined if verify of VL1_N has passed. If the answer at decision step 2116 is yes, then the memory cell is in the first QPW zone, and at step 2118, the QPW bias level is set to QPW_1 and the process proceeds to step 2114. If the answer at decision step 2116 is no, then the threshold voltage of the memory cell is below VL1_N, and the process proceeds to step 2114 without applying a QPW bias.

If the answer at decision step 2108 is yes, then verify of the first programmed data state is completed and the process proceeds to step 2120. At step 2120, further programming of the memory cell is inhibited; Vpgm is incrementally increased (Vpgm=Vpgm+dVpgm); the data state is incrementally advanced to the next data state (N=N+1); and a Counter is set to one.

At step 2122, a Vpgm pulse is applied to the control gate of the selected word line. At step 2124, verify is performed on the memory cells being programmed to the Nth data state for VL2 N and VH_N (but not VL1_N).

At decision step 2126, it is determined if verify of VH_N has passed. If the answer at decision step 2126 is yes, then programming of data state N is complete and the process proceeds to decision step 2128. At decision step 2128, it is determined if the Nth data state is the last data state being programmed. If the answer at decision step 2128 is yes, then if programming of all memory cells is completed, at step 2130, the programming operation is completed. If the answer at decision step 2128 is no, then the process returns to step 2120.

If the answer at decision step 2126 is no, then the process proceeds to decision step 2132. If the answer at decision step 2132 is yes, then the memory cell is in the second QPW zone, and the process proceeds to step 2134. At step 2134, the QPW bias is set to QPW_2. At step 2136, Vpgm is incrementally increased (Vpgm=Vpgm+dVpgm), and the Counter is also incrementally increased (Counter=Counter+1). The process then returns to step 2122 to begin a next program-verify iteration.

If the answer at decision step 2132 is no, then the process proceeds to decision step 2138. If the answer at decision step 2138 is yes, then the memory cell is in the first QPW zone, and the process proceeds to step 2140. At step 2140, a QPW bias is set to QPW 1, and the process proceeds to step 2136.

If the answer at decision step 2138 is no, then the memory cell is below the first QPW zone, and the process proceeds to step 2136 without a QPW bias.

Although the flow chart in FIG. 21 illustrates the data states as being verified sequentially (one data state at a time), in most embodiments, multiple data states are verified after the programming pulse in each program-verify iteration.

Figure 16:
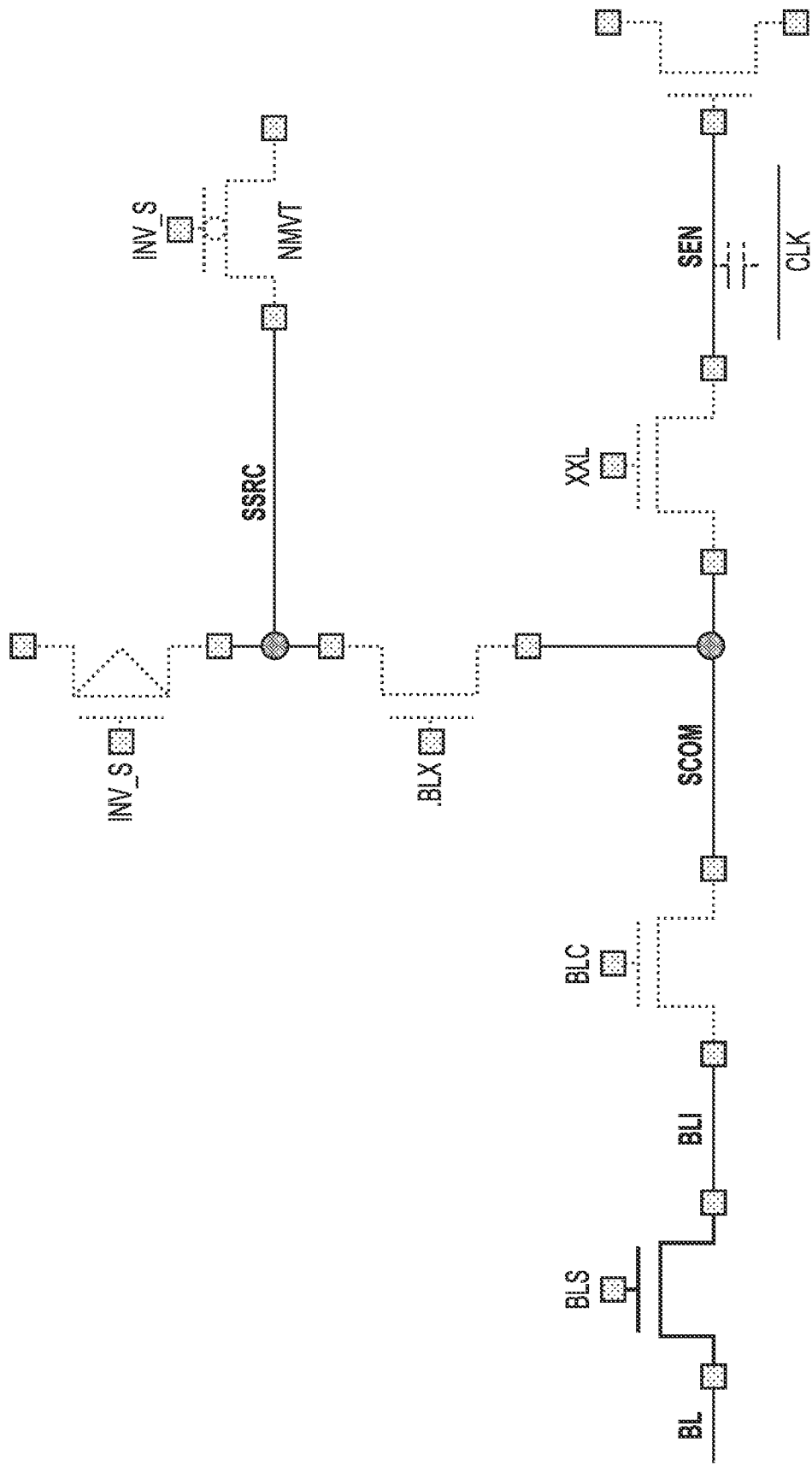
FIG. 16 schematically depicts circuitry for discharging a sense node through a bit line according to an example embodiment of the present disclosure.

Another aspect of the present disclosure is related to a dual zone QPW programming technique wherein the first verify low voltage VL1, the second verify low voltage VL2, and the verify high voltage VH are all sensed together rather than with separate verify pulses to improve performance of the dual zone QPW programming operation. Specifically, in an embodiment, all of VL1, VL2, and VH are sensed with a single verify pulse applied to the control gate of the selected word line as the discharge of a sense node SEN is monitored. Since the memory cells near VL1 have a lower channel resistance than memory cells near VL2 and VH, the memory cells near VL1 will pass more current than the memory cells near VL2 and VH. Likewise, the memory cells near VL2 have a lower channel resistance and will pass more current than the memory cells near VH. By monitoring how long it takes for a sense node SEN to discharge (more current will lead to a quicker discharge time) from an initial voltage to a lower voltage, it can thus be determined whether the memory cell has a threshold voltage lower than VL1; between VL1 and VL2; between VL2 and VH; or above VH. FIG. 16 depicts example circuitry configured to perform such a sensing operation with BL identifying the bit line that the sense node SEN is being discharged through.

Figure 17:
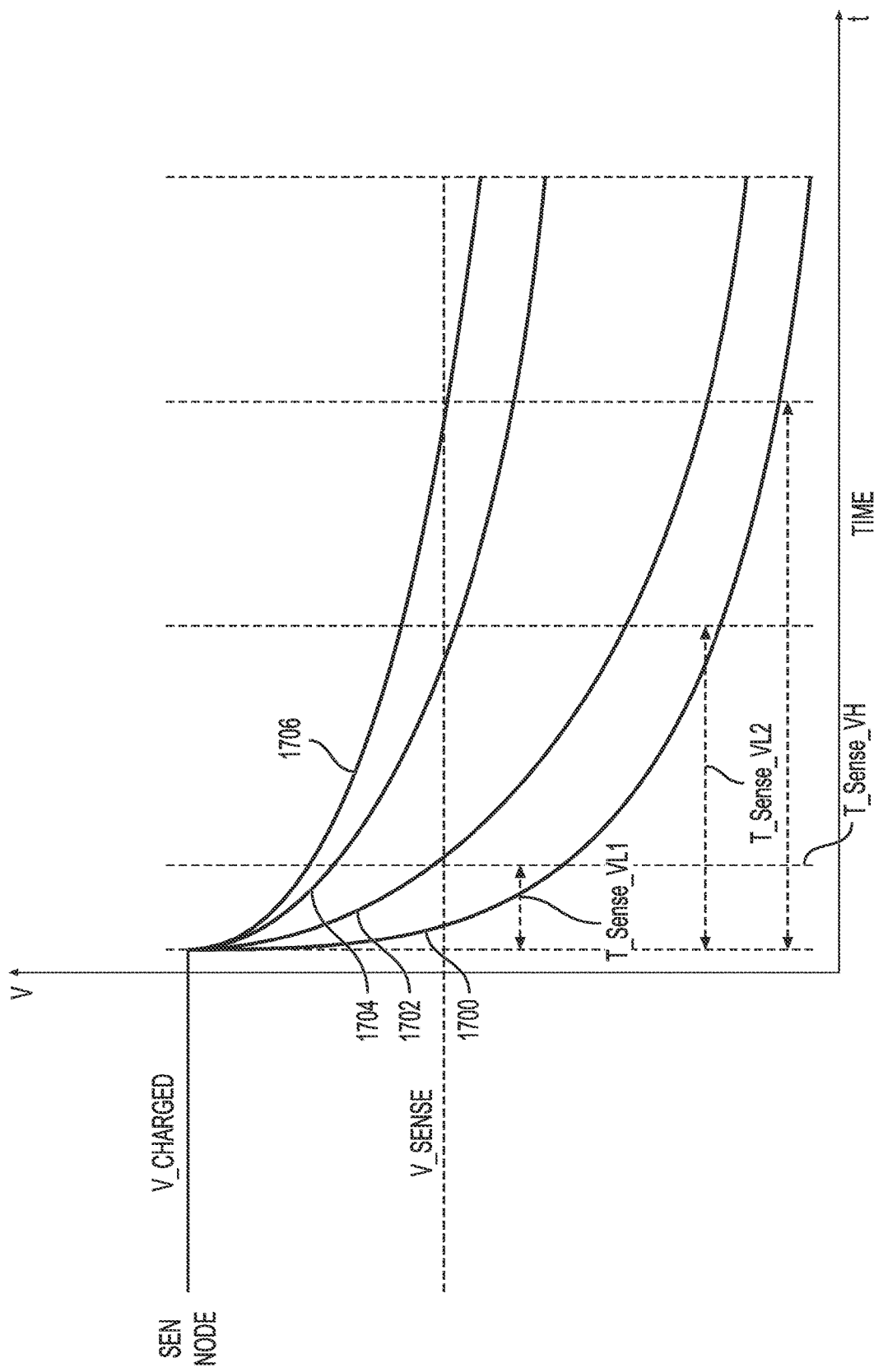
FIG. 17 depicts a voltage of a sense node versus time during an exemplary embodiment of a sensing operation.

Turning now to FIG. 17, in operation, the sense node SEN is charged to a charged voltage V_charged. During sensing, the voltage of the SEN transistor is monitored by the clock CLK as the sense node SEN is discharged from V_charged to a predetermined sensing voltage V_sense. If the time to discharge the voltage of SEN to V_sense is less than a first predetermined time T_Sense_VL1 for a given data state, then the threshold voltage of the memory cell coupled to the bit line BL is lower than VL1 for that data state. If the time to discharge the voltage of the SEN transistor to V_sense is between the first predetermined time T_Sense_VL1 and a second predetermined time T_Sense_VL2 that is greater than the first predetermined time T_Sense_VL1, then the Vth of the memory cell is between VL1 and VL2 of the data state. If the time to discharge the voltage of the SEN to V_sense is between the second predetermined time T_Sense_VL2 and a third predetermined time T_sense_VH that is greater than the second predetermined time T_Sense_VL2, then the Vth of the memory cell is between VL2 and VH of the data state. If the time to discharge the voltage of SEN to V_sense is greater than the third predetermined time T_sense_VH, then the Vth of the memory cell is greater than VH of the data state. By employing this tactic, it can be determined if the memory cell is below the QPW zones, in the first QPW zone, in the second QPW zone, or in the inhibit zone. As discussed above, if the memory cell is below the QPW zones, programming should proceed at full speed; if the memory cell is in the first QPW zone, then the first biasing voltage QPW_1 is to be applied during the subsequent programming pulse; if the memory cell is in the second QPW zone, then the second biasing voltage QPW_2 is to be applied during the subsequent programming pulse; and if the memory cell in the inhibit zone, then the inhibit voltage VDDSA should be applied during the subsequent programming pulse. In the example depicted in FIG. 17, curve 1700 illustrates the voltage of the SEN node as it is discharged through a channel containing a memory cell with a threshold voltage that is below VL1, curve 1702 illustrates the voltage of the SEN node as it is discharged through a channel containing a memory cell with a VT that is in the first QPW zone; curve 1704 illustrates the voltage of the SEN node as it is discharged through a channel containing a memory cell with a threshold voltage that is in the second QPW zone; and curve 1706 illustrates the voltage of the SEN node as it is discharged through a channel containing a memory cell with a VT in the inhibit zone.

Figure 18:
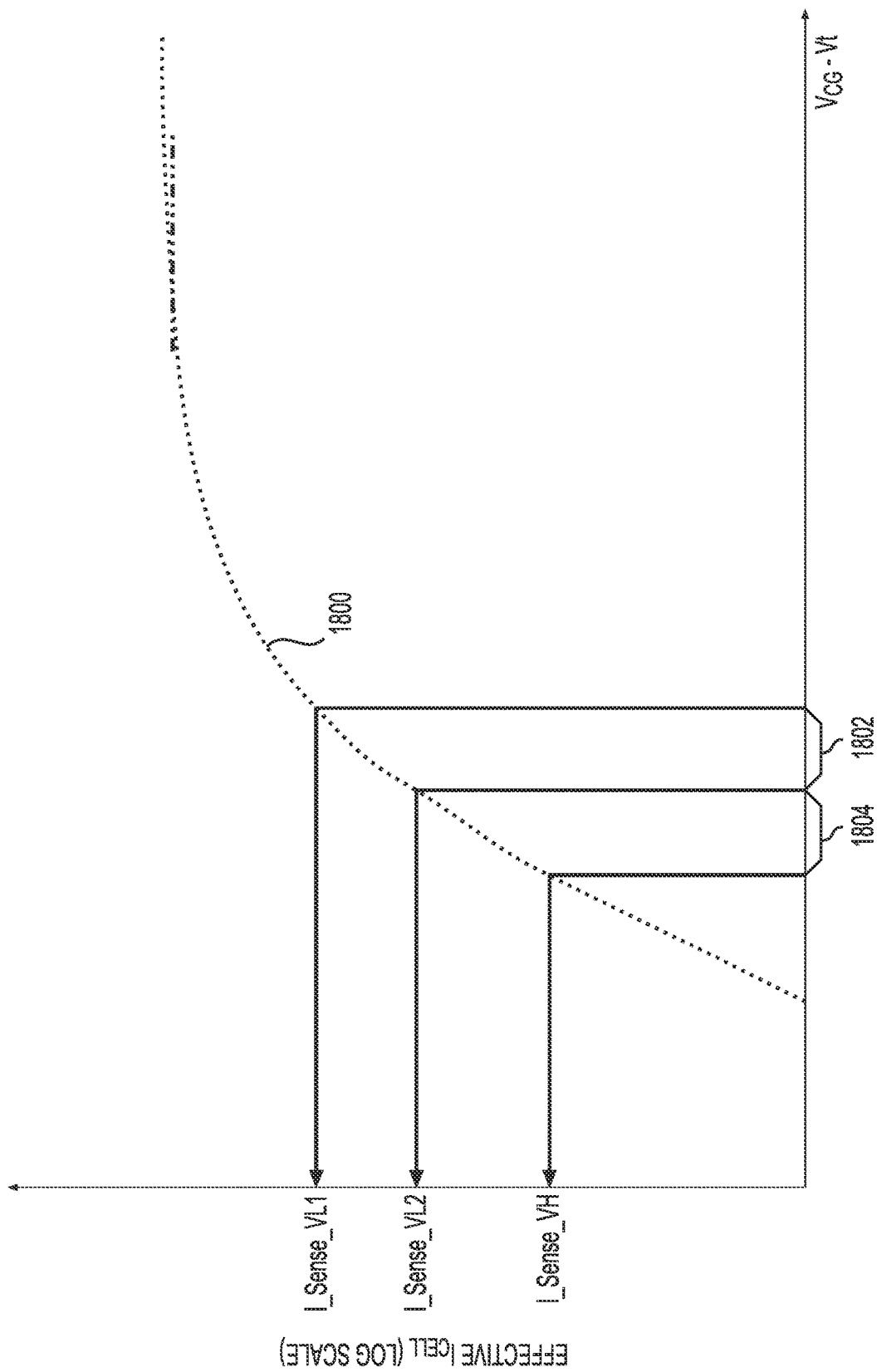
FIG. 18 depicts a plot of current versus a difference between control gate voltage and a threshold voltage of a memory cell during a sensing operation according to one embodiment of the present disclosure.

Turning now to FIG. 18, a plot of current (Icell) versus the difference between control gate voltage and threshold voltage is depicted for memory cells. The discharge time of the sense node SEN is inversely proportional to the cell current. Therefore, for each programmed data state, the sensing times T_Sense_VL1, T_Sense_VL2, and T_Sense_VH can all be equated to currents I_Sense_VL1, I_Sense_VL2, and I_Sense_VH, respectively, which are all shown in the plot of FIG. 18. If the current is greater than I_Sense_VL1, then the memory cell being sensed has a threshold voltage that is less than VL1; if the current is between I_Sense_VL1 and I_Sense_VL2, then the memory cell being sensed has a threshold voltage in the first QPW zone 1802; if the current is between I_Sense_VL2 and I_Sense_VH, then the memory cell being sensed has a threshold voltage in the second QPW zone 1804; and if the current is greater than I_Sense_VH, then the memory cell being sensed has a threshold voltage in the inhibit window.

Figure 19:
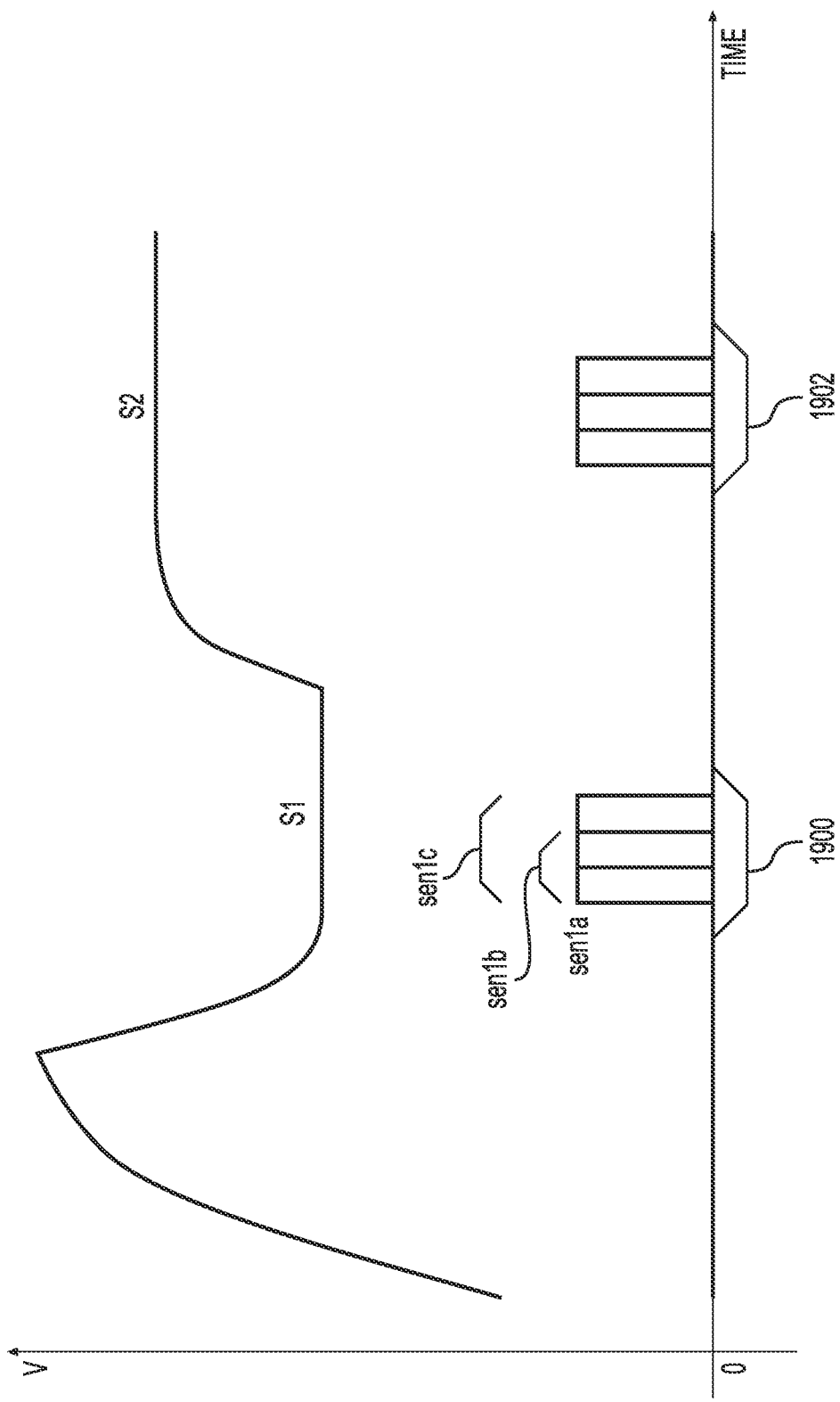
FIG. 19 depicts a plot of voltage versus time during an exemplary verify operation and identifies when the sensing takes place during the verify operation.

As illustrated in FIG. 19, the voltage applied to the control gate of the selected word line is illustrated during a verify operation which follows a programming pule. In this example, verify is conducted for multiple programmed data states, specifically data states S1 and S2, although any two or more data states could be verified. Reference numeral 1900 identifies the sensing of VL1, VL2, and VH for data state S1, and reference numeral 1902 identifies the sensing of VL1, VL2, and VH for data state S2. This operation may be quicker (less time consuming) than other sensing operations where VL1, VL2, and VH are all sensed independently of one another, thereby improving the performance of the memory device.

In some embodiments, programming with the QPW programming techniques of this aspect of the present disclosure have been found to improve performance by thirty-six percent (36%) with little to no change in the average threshold voltage window (reliability). These programming techniques can be used in any multi-bit per memory cell programming operation, such as MLC, TLC, or QLC.

Figure 22:
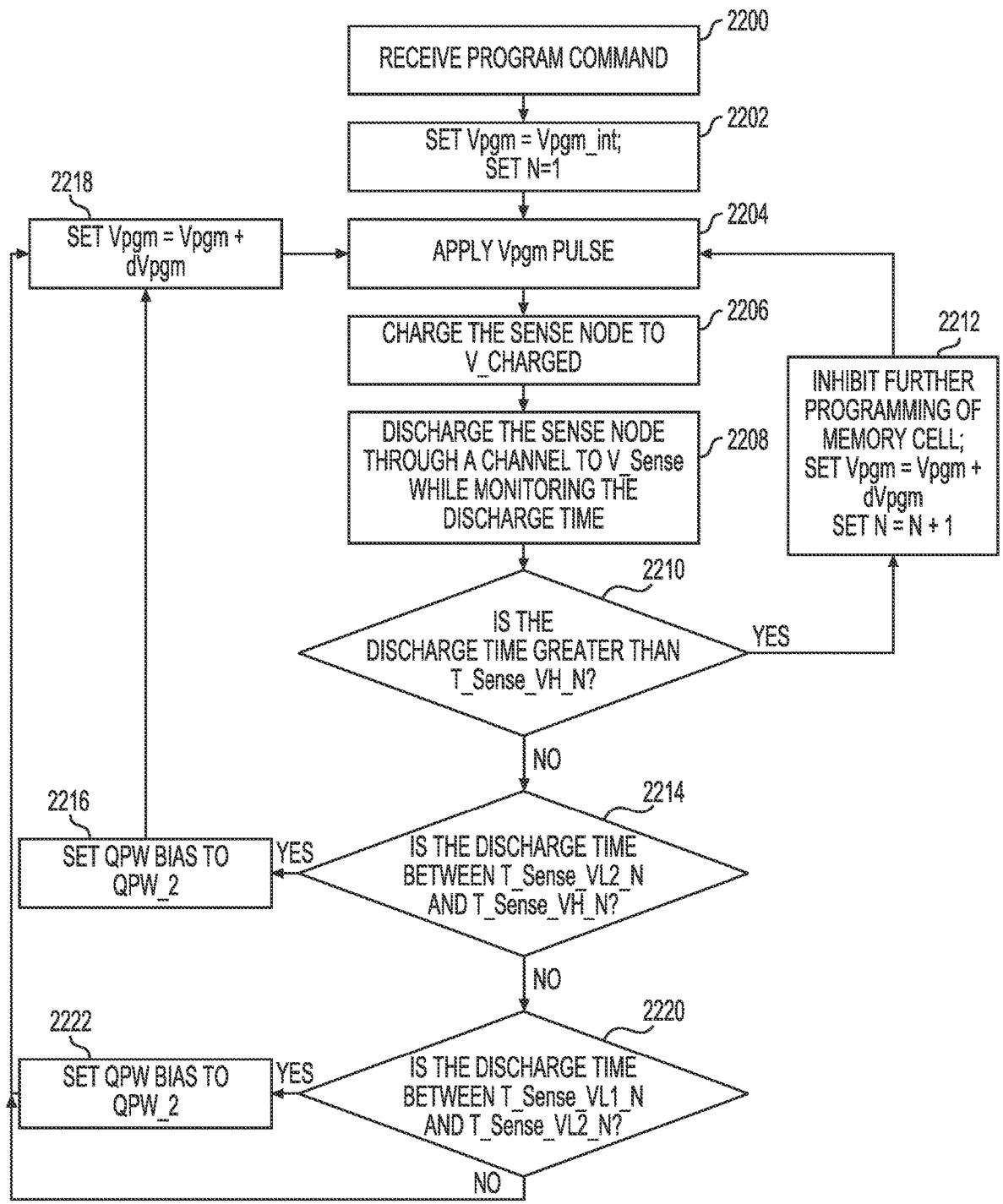
FIG. 22 is a flow chart depicting the steps of programming the memory cells according to another exemplary embodiment of the present disclosure.

Turning now to FIG. 22, a flow chart depicting the steps of another exemplary programming process is depicted. At step 2200, a command is received by the controller to program the memory cells of a selected word line. At step 2202, the programming voltage Vpgm is set to an initial value, Vpgm_int, and a data state being programmed N is set to one. At step 2204, a Vpgm pulse is applied to the control gate of the selected word line.

At step 2206, the sense node is charged to a charged voltage V_charged. At step 2208, the sense node is discharged through a channel containing a memory cell to be sensed to a sense voltage V_Sense while the discharge time is monitored or measured.

At decision step 2210, it is determined if the discharge time is greater than the verify high sense time associated with data state N, i.e., T_Sense_VH_N. If the answer at decision step 2210 is yes, then the threshold voltage of the memory cell is greater than VH of data state N and programming of that memory cell is completed. The process proceeds to step 2212, at which point, further programming of the memory cell is inhibited; Vpgm is incrementally increased (Vpgm=Vpgm+dVpgm); and the data state being programmed is incrementally increased (N=N+1). The process then returns to step 2204 to begin a next program-verify iteration.

If the answer at decision step 2210 is no, then the process proceeds to decision step 2214. At decision step 2214, it is determined if the discharge time is between T_Stense_VL2_N and T_Sense_VH_N. If the answer at decision step 2214 is yes, then the threshold voltage of the memory cell is in the second QPW zone, and at step 2216, the QPW bias is set to QPW_2. The process then proceeds to step 2218. At step 2218, Vpgm is incrementally increased (Vpgm=Vpgm+dVpgm). The process then returns to step 2204 to begin a next program-verify iteration.

If the answer at decision step 2214 is no, then the process proceeds to decision step 2220. At decision step 2220, it is determined if the discharge time is between T_Stense_VL1_N and T_Sense_VL2_N. If the answer at decision step 2220 is yes, then the threshold voltage of the memory cell is in the first QPW zone. At step 2222, the QPW bias is set toe QPW_2, and the process proceeds to step 2218.

If the answer at decision step 2220 is no, then the threshold voltage of the memory cell is below the first QPW zone, and the process proceeds to step 2218 without applying a QPW bias.

Yet another aspect of the present disclosure is related to a QPW programming technique wherein the verify low voltage VL of a data state N+1 is sensed concurrently with the sensing of VH of a previous data state N. This is accomplished by, during the sensing operation, applying different bit line biasing voltages to different bit lines coupled to memory cells that are being programmed to data state N and data state N+1, which is in contrast to the above-described sensing technique where there is no difference in the bit line biases across the word line.

Figure 20:
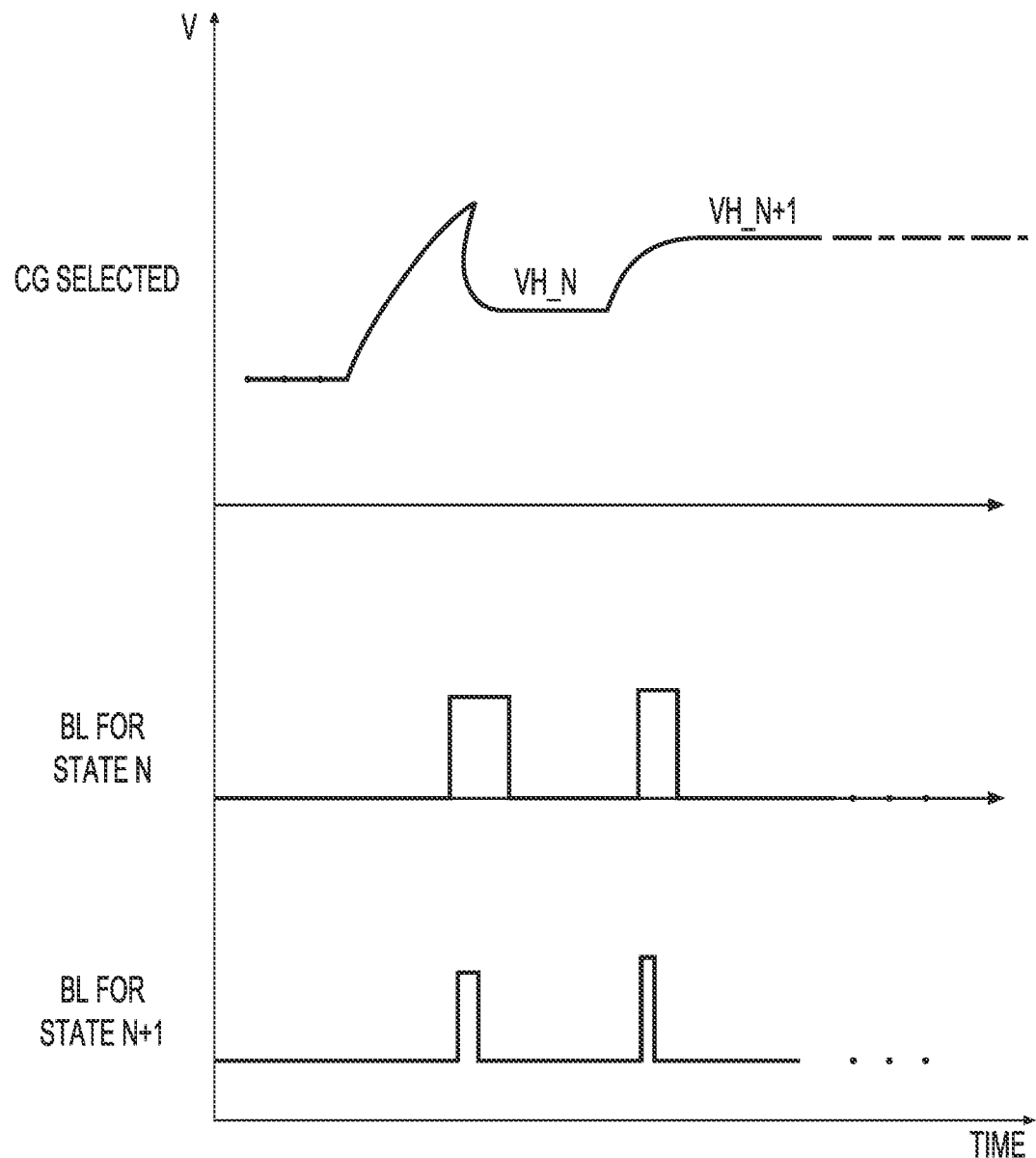
FIG. 20 identifies control gate and bit line voltages applied during a verify operation of an exemplary embodiment of the present disclosure.

Turning now to FIG. 20, during a verify operation, the voltage applied to the control gate of the selected word line is ramped to a verify high VH_N voltage associated with data state N (for example, S1) and then, after a predetermined time, it is further ramped to a second verify voltage associated with data state N+1 (for example, S2). A first set of bit lines coupled to channel that include a memory cells which are being programmed to data state N are held at a first biasing voltage (for example, zero Volts). Then, with the control gate being held at the VH_N voltage, the sense node SEN is charged to the charged voltage V_charged and then discharged through the first set of bit lines to the sensed voltage V_sense. For each bit line of the first set of bit lines, if the time to discharge from V_charged to V_sense is less than T_Sense_VH_N, then the VT of the memory cell is less than VH and QPW programming of the memory cell should continue in the next program-verify iteration. If the time to discharge from V_charged to V_sense is greater than T_Sense_VH_N, then the VT of the memory cell is greater than VH and further programming of the memory cell should be inhibited. The first set of bit lines may include one or more bit lines depending on the number of memory cells being programmed to data state N in the selected word line.

Concurrent with the sensing of the memory cell being programmed to data state N, a second set of bit lines coupled channels that include a memory cells being programmed to data state N+1 is held at a second biasing voltage that is greater than the first biasing voltage. Then, with the control gate being held at the VH_N voltage, the sense node SEN is charged to the charged voltage V_charged and then discharged to the sensed voltage V_sense through the second set of bit lines. For each bit line of the second set of bit lines, if the time to discharge from V_charged to V_sense is less than T_Sense_VL_N+1, then the VT of the memory cell is less than VL_N+1, and programming should continue without QPW in the next program-verify iteration. If the time to discharge from V_charged to V_sense is greater than T_Sense_VL_N+1, then the memory cell is in the QPW zone, and QPW programming should be employed during the subsequent program-verify iteration. When the voltage applied to the control gate of the selected word line is ramped to the second verify voltage, then this process can be repeated to concurrently verify VH_N+1 and VL_N+2.

This operation can be repeated during the programming of all programmed data states, e.g., S1-S15. In other words, verify low for data state S2 is verified concurrent with verify high for data state S1, verify low for data state S3 is verified concurrent with verify high for data state S2, verify low for data state S4 is verified concurrent with verify high for data state S3, and so on.

In some embodiments, the concurrent sensing with different VBL biasing voltages can be used in conjunction with dual zone QPW programming. In one such embodiment, two different sense times can be monitored during the verify low sensing to detect VL1 and VL2 for any data state in the manner discussed above. Another approach would be to include an additional charging and discharging of the sense node SEN to compare the threshold voltage of the memory cell to VL2. Yet another approach utilizes a third bit line bias voltage can be employed to concurrently sense a verify voltage (such as VL1) of a third data state, e.g., N+2.

With concurrent sensing, the benefit of QPW is improved by reducing verify time, thereby improving performance of the memory device with little to no loss in reliability. In some examples, these operations have been found to improve performance by approximately twenty-seven percent (27%) with no loss in reliability.

Figure 23:
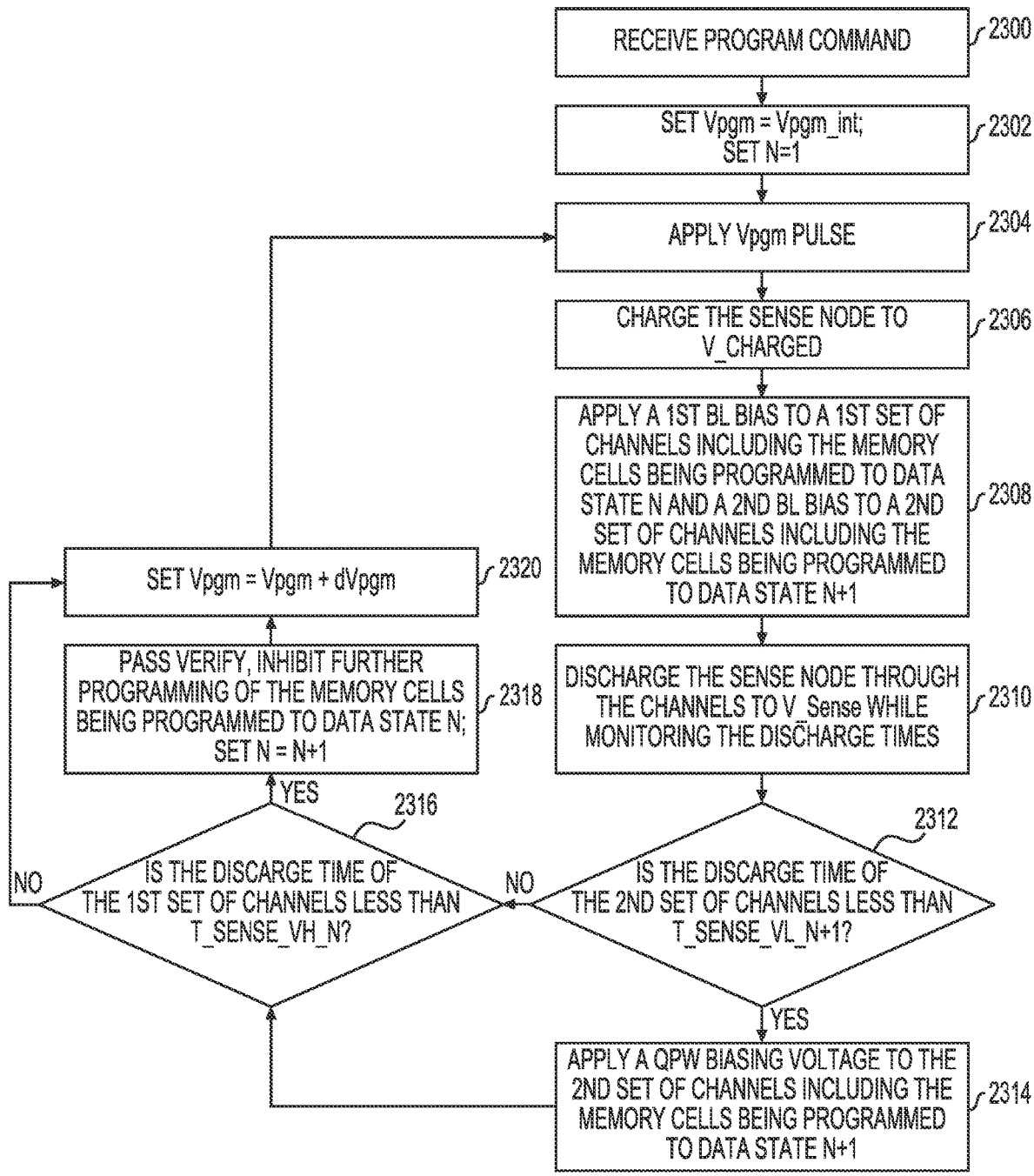
FIG. 23 is a flow chart depicting the steps of programming the memory cells according to yet another exemplary embodiment of the present disclosure.

Turning now to FIG. 23, a flow chart depicting the steps of an exemplary programming process is depicted. At step 2300, a programming command is received to program the memory cells of a selected word line. At step 2302, the programming voltage Vpgm is set to an initial value, Vpgm_int, and a data state being programmed N is set to one. At step 2304, a Vpgm pulse is applied to the control gate of the selected word line.

Turning now to FIG. 23, a flow chart depicting the steps of yet an exemplary programming process is depicted. At step 2300, a programming command is received to program the memory cells of a selected word line. At step 2302, the programming voltage Vpgm is set to an initial value, Vpgm_int, and a data state being programmed N is set to one. At step 2304, a Vpgm pulse is applied to the control gate of the selected word line.

At step 2306, the sense node is charged to a charged voltage V_Charged. At step 2308, a first biasing voltage is applied to a first set of channels coupled with the memory cells being programmed to data state N, and a second biasing voltage is applied to a second set of channels coupled with the memory cells being programmed to data state N+1.

At step 2310, the sense node is discharged through the first and second sets of channels while the discharge times are monitored.

At decision step 2312, for each memory cell being programmed to the data state N+1, it is determined if the discharge time through the associated channel of the second set of channels. If the answer at decision step 2312 is yes, then at step 2314, then the memory cell has a threshold voltage that is greater than VL_N, and a QPW biasing voltage is applied to the respective channel to slow programming of the memory cell during further programming pulses.

If the answer at decision step 2312 is no or following step 2314, the process proceeds to decision step 2316. At decision step 2316, for each memory cell being programmed to data state N, it is determined if the discharge time is less than T_Stense_VH_N.

If the answer at decision step 2316 is yes, then the threshold voltage of the memory cell is greater than VH_N, and at step 2318, memory cell passes verify and further programming of the memory cell is inhibited. Once all of the memory cells being programmed to data state N pass verify, the data state being programmed is advanced, i.e., N=N+1.

If the answer at decision step 2316 is no or following step 2318, at step 2320, Vpgm is incrementally advanced, i.e., Vpgm=Vpgm+dVpgm. The process then returns to step 2304. These steps continue until verify passes for all programmed data states.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
   preparing a memory device that includes an array of memory cells arranged in a plurality of word lines;
   programming the memory cells of a selected word line of the plurality of word lines in a plurality of program-verify iterations;
   during a verify portion of at least one program-verify iteration of the plurality of program-verify iterations, determining a threshold voltage of at least one memory cell of the selected word line relative to a first verify low voltage VL1, a second verify low voltage VL2, and a verify high voltage VH associated with a data state being programmed; and
   wherein the step of determining the threshold voltage of the at least one memory cell includes maintaining a count of program-verify iterations since the at least one memory cell passed a verify high voltage of a previously programmed data state or includes discharging a sense node through a channel including the at least one memory cell and comparing a discharge time to predetermined sense times associated with the first and second verify low voltages and with the verify high voltage.

2. The method as set forth in claim 1 further including the step of applying a programming pulse to a control gate of the selected word line and applying a first quick pass write (QPW) voltage to at least one bit line coupled with the at least one memory cell in response to a determination in a previous program-verify iteration that the at least one memory cell has a threshold voltage between the first and second verify low voltages VL1, VL2 and applying a second QPW voltage to the at least one bit line coupled with the at least one memory cell in response to a determination in a previous program-verify iteration that the at least one memory cell has a threshold voltage between the second verify low voltage VL2 and the verify high voltage VH and wherein the second QPW voltage is greater than the first QPW voltage.

3. The method as set forth in claim 2 wherein no biasing voltage is applied to the at least one bit line coupled with the at least one memory cell in response to a determination in a previous program-verify iteration that the at least one memory cell has a threshold voltage that is less than the first verify low voltage VL1.

4. The method as set forth in claim 2 wherein the step of determining the threshold voltage of the at least one memory cell includes determining that the threshold voltage of the at least one memory cell includes determining that the threshold voltage of the at least one memory cell is between the first verify low voltage VL1 and the second verify low voltage VL2 in response to the count of program-verify iterations since the at least one memory cell passed verify high of the previous data state being above a predetermined threshold.

5. The method as set forth in claim 4 wherein the predetermined threshold is two program-verify iterations.

6. The method as set forth in claim 4 wherein during the verify portion of the at least one program-verify iteration, a first verify pulse at the second verify low voltage VL2 is applied to the control gate of the selected word line and a second verify pulse at the verify high VH voltage is applied to the control gate of the selected word line.

7. The method as set forth in claim 2 wherein the discharge time is a time it takes the sense node to discharge from a charged voltage V_charged to a sense voltage V_sense and wherein the step of determining the threshold voltage of the at least one memory cell includes comparing the discharge time to a first sensing time T_Sense_VL1 associated with the first verify low voltage VL1, to a second sensing time T_Sense_VL2 associated with the second verify low voltage VL2, and to a third sensing time T_Sense_VH associated with the verify high voltage VH.

8. The method as set forth in claim 7 wherein the threshold voltage of the at least one memory cell is determined to be below the first verify low voltage VL1 in response to the discharge time being less than the first sensing time T_Sense_VL1; is determined to be between the first and second verify low voltages VL1, VL2 in response to the discharge time being between the first and second sensing time T_Sense_VL1, T_Sense_VL2; is determined to be between the second verify low voltage VL2 and the verify high voltage VH in response to the discharge time being between the second and third sensing times T_Sense_VL2, T_Sense_VH; and is above the verify high voltage VH in response to the discharge time being greater than the third sensing time T_Sense_VH.

9. A memory device, comprising:
   an array of memory cells arranged in a plurality of word lines;
   a controller configured to program the memory cells of a selected word line of the plurality of word lines in a plurality of program-verify iterations, during a verify portion at least one of the program-verify iterations, the controller being further configured to:
      determine a threshold voltage of at least one memory cell of the selected word line relative to a first verify low voltage VL1, a second verify low voltage VL2, and a verify high voltage VH associated with a data state being programmed; and
      to determine the threshold voltage of the at least one memory cell, the controller is configured to maintain a count of program-verify iterations since the at least one memory cell passed a verify high voltage of a previously programmed data state or is configured to discharge a sense node through a channel including the at least one memory cell and compare a discharge time to predetermined sense times associated with the first and second verify low voltages and with the verify high voltage.

10. The memory device as set forth in claim 9, wherein the controller is further configured to apply a programming pulse to a control gate of the selected word line and apply a first quick pass write (QPW) voltage to at least one bit line coupled with the at least one memory cell in response to a determination in a previous program-verify iteration that the threshold voltage of the at least one memory cell is between the first and second verify low voltages VL1, VL2; and apply a second QPW voltage to the at least one bit line coupled with the at least one memory cell in response to a determination in a previous program-verify iteration that the threshold voltage of the at least one memory cell is between the second verify low voltage VL2 and the verify high voltage VH, and wherein the second QPW voltage is greater than the first QPW voltage.

11. The memory device as set forth in claim 10 wherein the controller is configured to apply no biasing voltage to the at least one bit line coupled with the at least one memory cell in response to a determination in a previous program-verify iteration that the at least one memory cell has a threshold voltage that is less than the first verify low voltage VL1.

12. The memory device as set forth in claim 10 wherein the controller is configured to determine that the threshold voltage of the at least one memory cell is between the first verify low voltage VL1 and the second verify low voltage VL2 in response to the count of program-verify iterations since the at least one memory cell passed verify high of the previous data state being above a predetermined threshold.

13. The memory device as set forth in claim 12 wherein the predetermined threshold is two program-verify iterations.

14. The memory device as set forth in claim 12 wherein during the verify portion of the at least one program-verify iteration, the controller is configured to apply a first verify pulse at the second verify low voltage VL2 to the control gate of the selected word line and to apply a second verify pulse at the verify high VH voltage to the control gate of the selected word line.

15. The memory device as set forth in claim 10 wherein the discharge time is a time it takes the sense node to discharge from a charged voltage V_charged to a sense voltage V_sense and wherein to determine the threshold voltage of the at least one memory cell, the controller compares the discharge time to a first sensing time T_Sense_VL1 associated with the first verify low voltage VL1, to a second sensing time T_Sense_VL2 associated with the second verify low voltage VL2, and to a third sensing time T_Sense_VH associated with the verify high voltage VH.

16. The memory device as set forth in claim 15 wherein the controller determines the threshold voltage to be below the first verify low voltage VL1 in response to the discharge time being less than the first sensing time T_Sense_VL1; the controller determines the threshold voltage to be between the first and second verify low voltages VL1, VL2 in response to the discharge time being between the first and second sensing time T_Sense_VL1, T_Sense_VL2; the controller determines the threshold voltage to be between the second verify low voltage VL2 and the verify high voltage VH in response to the discharge time being between the second and third sensing times T_Sense_VL2, T_Sense_VH; and the controller determines the threshold voltage to be above the verify high voltage VH in response to the discharge time being greater than the third sensing time T_Sense_VH.

17. A method of programming a memory device, comprising the steps of:
preparing a memory device that includes an array of memory cells arranged in a plurality of word lines;
programming the memory cells of a selected word line of the plurality of word lines in a plurality of program-verify iterations;
during a verify portion of at least one program-verify iteration of the plurality of program-verify iterations:
charging a sense node SEN to a charged voltage V_charged;
concurrently discharging the sense node SEN from the charged voltage V_charged to a sense voltage V_sense through a first set of channels coupled with at least one memory cell that is being programmed to a programmed data state N while a first biasing voltage is applied to at least one bit line coupled with the first set of channels and discharging the sense node SEN through a second set of channels coupled with at least one memory cell that is being programmed to a next programmed data state N+1 while a second biasing voltage that is different than the first biasing voltage is applied to at least one bit line coupled with the second set of channels;
comparing a discharge time of the sense node SEN from V_charged to V_sense through the first set of channels to a first predetermined sense time T_Sense_VH_N to determine if a threshold voltage of the at least one memory cell being programmed to the data state N has passed a verify high voltage VH of the data state N; and
comparing a discharge time of the sense node SEN from V_charged to V_sense through the second set of channels to a second predetermined sense time T_Sense_VL_N+1 to determine if a threshold voltage of the at least one memory cell being programmed to the data state N+1 has passed a verify low voltage VL of data state N+1.

18. The method as set forth in claim 17 wherein the second biasing voltage is greater than the first biasing voltage.

19. The method as set forth in claim 18 wherein the first predetermined sense time T_Sense_VH_N is different than the second predetermined sense time T_Sense_VL_N+1.

20. The method as set forth in claim 17 further including the step of applying a programming pulse to a control gate of the selected word line and applying a QPW voltage to a bit line coupled to at least one memory cell that is determined to have a threshold voltage above a verify low voltage VL and below the verify high voltage VH of data state N to slow programming of the at least one memory cell.

* * * * *